United States Patent
Jeunink et al.

(10) Patent No.: US 10,514,615 B2
(45) Date of Patent: Dec. 24, 2019

(54) SUPPORT APPARATUS, LITHOGRAPHIC APPARATUS AND DEVICE MANUFACTURING METHOD

(71) Applicant: ASML NETHERLANDS B.V., Veldhoven (NL)

(72) Inventors: Andre Bernardus Jeunink, Bergeijk (NL); Robbert De Jong, Eindhoven (NL); Martinus Hendrikus Antonius Leenders, Rhoon (NL); Evelyn Wallis Pacitti, Eindhoven (NL); Thomas Poiesz, Veldhoven (NL); Frank Pieter Albert Van Den Berkmortel, Deurne (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/580,806

(22) PCT Filed: Jun. 21, 2016

(86) PCT No.: PCT/EP2016/064236
§ 371 (c)(1),
(2) Date: Dec. 8, 2017

(87) PCT Pub. No.: WO2016/207122
PCT Pub. Date: Dec. 29, 2016

(65) Prior Publication Data
US 2018/0231897 A1    Aug. 16, 2018

(30) Foreign Application Priority Data

Jun. 23, 2015 (EP) .................................. 15173348
Oct. 19, 2015 (EP) .................................. 15190337

(51) Int. Cl.
*G03B 27/58* (2006.01)
*G03F 7/20* (2006.01)

(52) U.S. Cl.
CPC .......... *G03F 7/707* (2013.01); *G03F 7/70341* (2013.01); *G03F 7/70783* (2013.01); *G03F 7/70858* (2013.01); *G03F 7/70875* (2013.01)

(58) Field of Classification Search
CPC .. G03F 7/70341; G03F 7/707; G03F 7/70875; G03F 7/70716
See application file for complete search history.

(56) References Cited

U.S. PATENT DOCUMENTS

| 4,509,852 A | 4/1985 | Tabarelli et al. |
| 2004/0207824 A1 | 10/2004 | Lof et al. |

(Continued)

FOREIGN PATENT DOCUMENTS

| EP | 1420298 A2 | 5/2004 |
| JP | 2008172214 A | 7/2008 |

(Continued)

OTHER PUBLICATIONS

Communication pursuant to Article 94(3) dated Oct. 10, 2018 issued in corresponding EP Application No. 16731124.0.

(Continued)

*Primary Examiner* — Peter B Kim
(74) *Attorney, Agent, or Firm* — Pillsbury Winthrop Shaw Pittman, LLP

(57) ABSTRACT

A support apparatus configured to support an object, the support apparatus includes a support body including an object holder to hold an object; an opening in the support body adjacent to an edge of the object holder; a channel in fluid communication with the opening via each of a plurality of passageways in the support body; and a passageway liner mounted in at least one of the plurality of passageways, the (Continued)

passageway liner being thermally insulating to substantially thermally decouple the support body from fluid in the at least one of the plurality of passageways.

18 Claims, 15 Drawing Sheets

(56) References Cited

U.S. PATENT DOCUMENTS

| | | |
|---|---|---|
| 2005/0264778 A1 | 12/2005 | Lof et al. |
| 2007/0229787 A1 | 10/2007 | Emoto |
| 2008/0137055 A1 | 6/2008 | Hennus et al. |
| 2008/0158526 A1 | 7/2008 | Hennus et al. |
| 2009/0296068 A1 | 12/2009 | Castelijns et al. |
| 2010/0045949 A1 | 2/2010 | Nakano et al. |
| 2011/0181849 A1 | 7/2011 | Patel et al. |
| 2013/0057837 A1 | 3/2013 | Ichinose et al. |
| 2015/0109599 A1 | 4/2015 | Koevoets et al. |
| 2015/0131064 A1 | 5/2015 | Laurent et al. |

FOREIGN PATENT DOCUMENTS

| | | |
|---|---|---|
| JP | 2011-222652 A | 11/2011 |
| TW | 200839462 A | 10/2008 |
| TW | 201250396 A | 12/2012 |
| TW | 201405253 A | 2/2014 |
| WO | 2004/112108 A1 | 12/2004 |
| WO | 2012/137797 A1 | 10/2012 |
| WO | 2013/178484 A1 | 12/2013 |
| WO | 2013178438 A1 | 12/2013 |

OTHER PUBLICATIONS

International Search Report and Written Opinion of the International Searching Authority issued in corresponding Application PCT/EP2016/064236 dated Oct. 6, 2016.

Notice of Reasons for Rejection dated Nov. 16, 2018 issued in corresponding Japanese Patent Application No. 2017-560732 with English Translation.

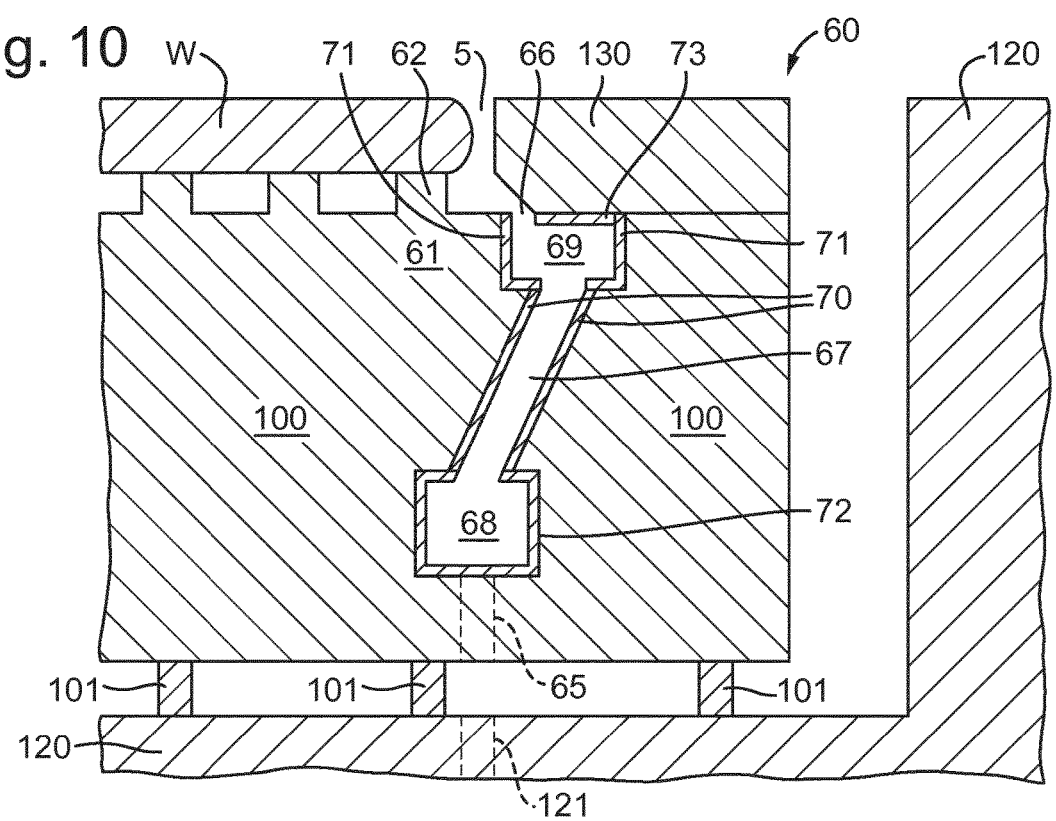
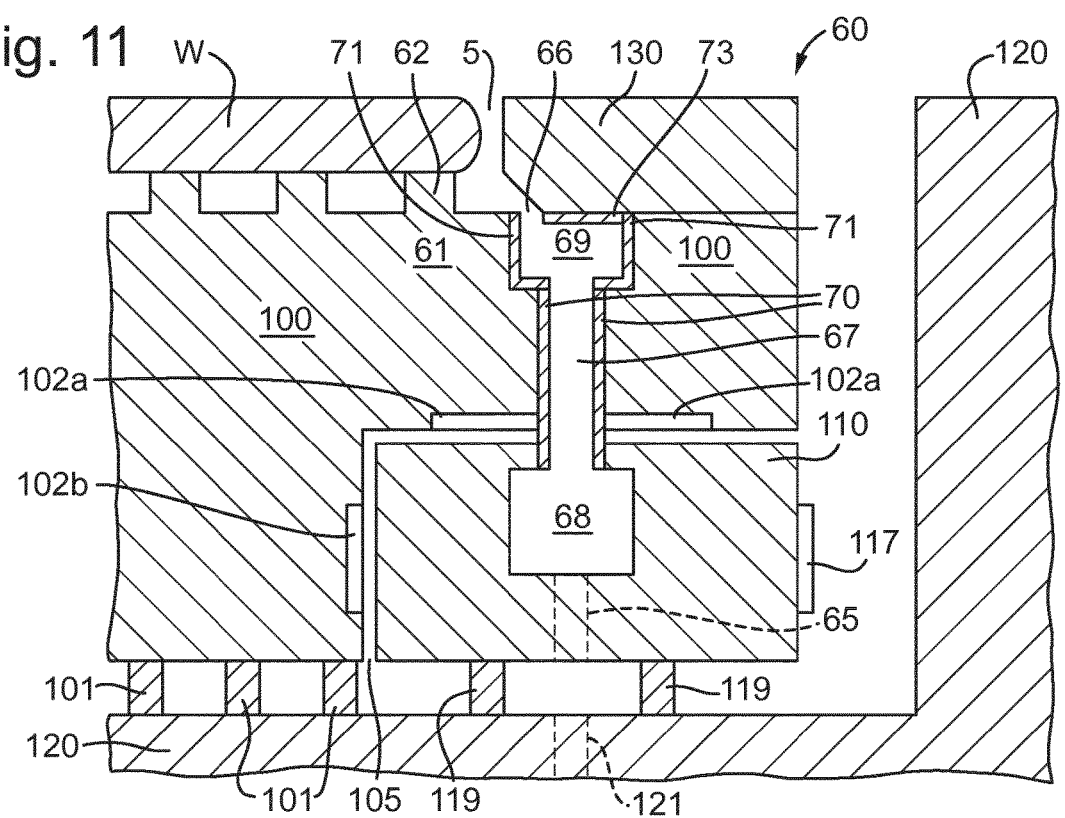

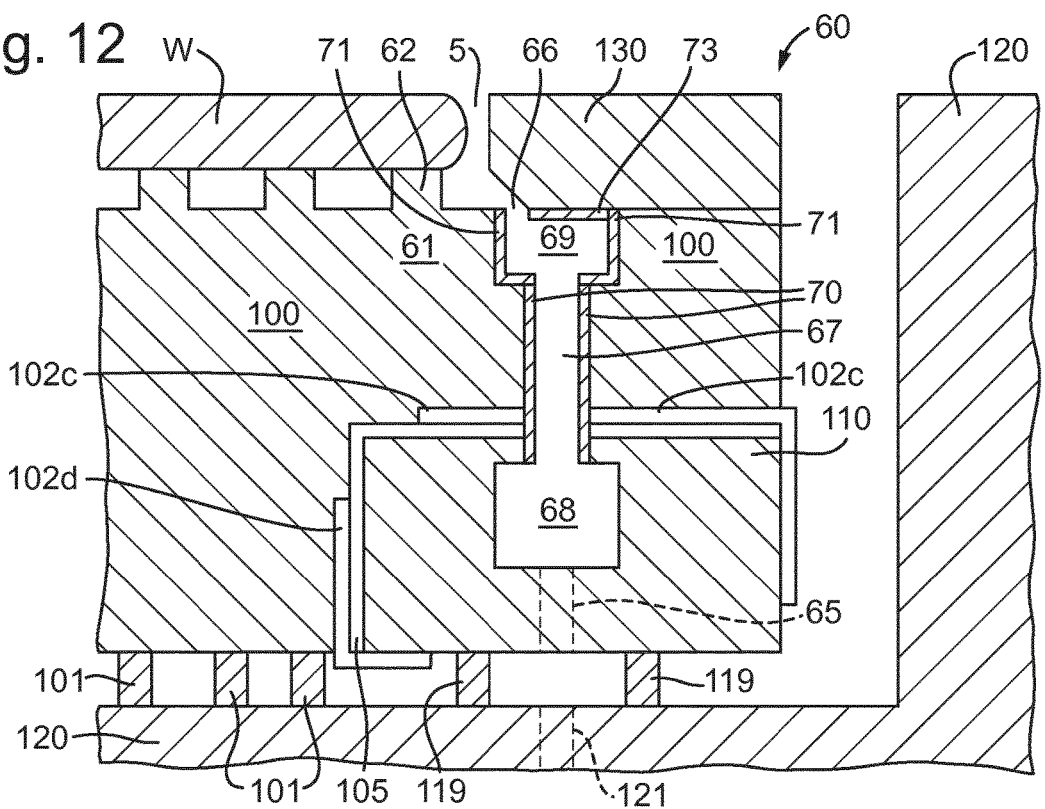
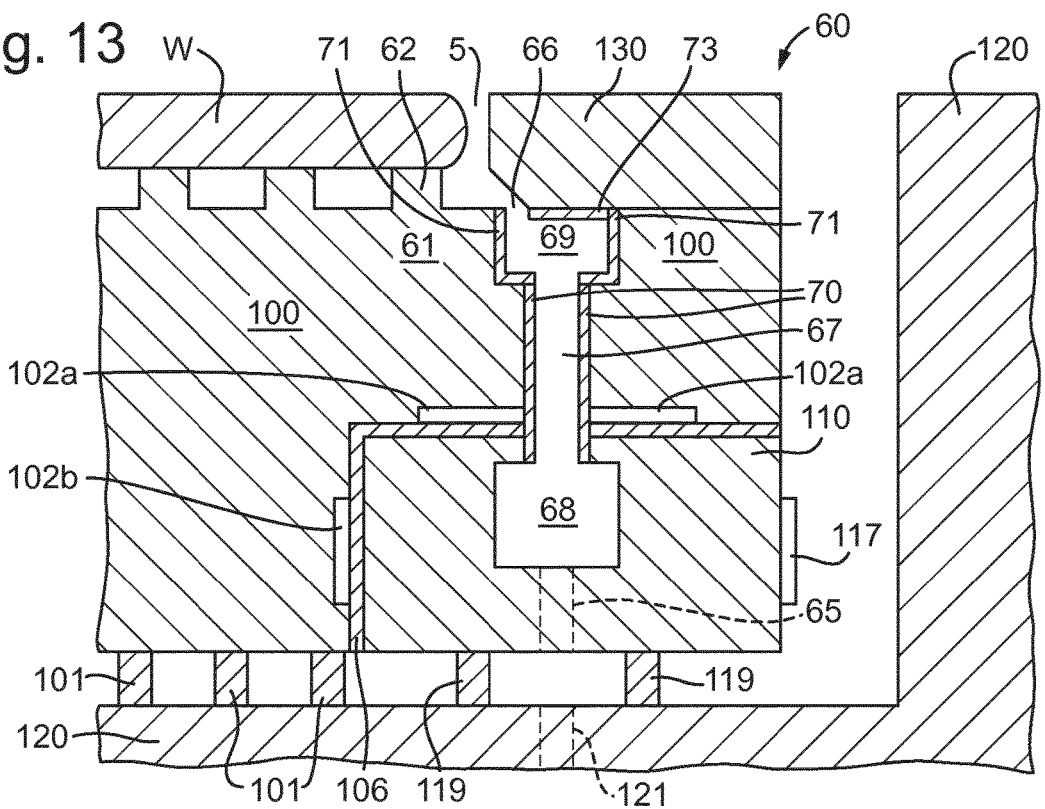

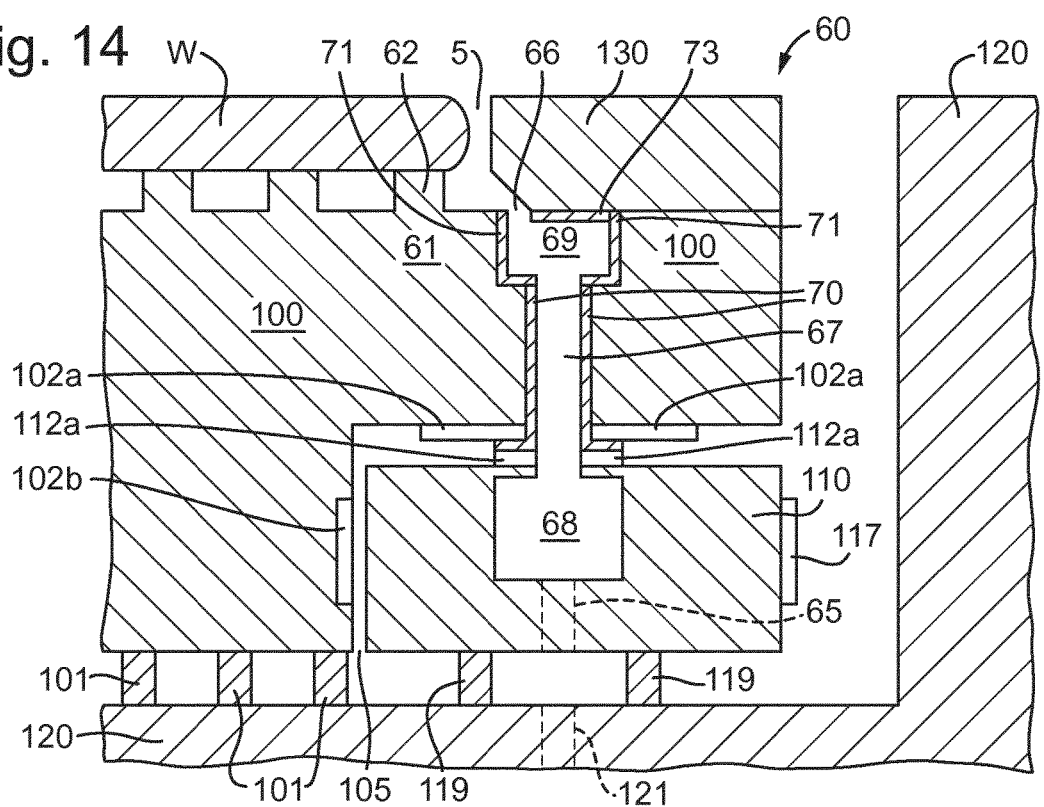
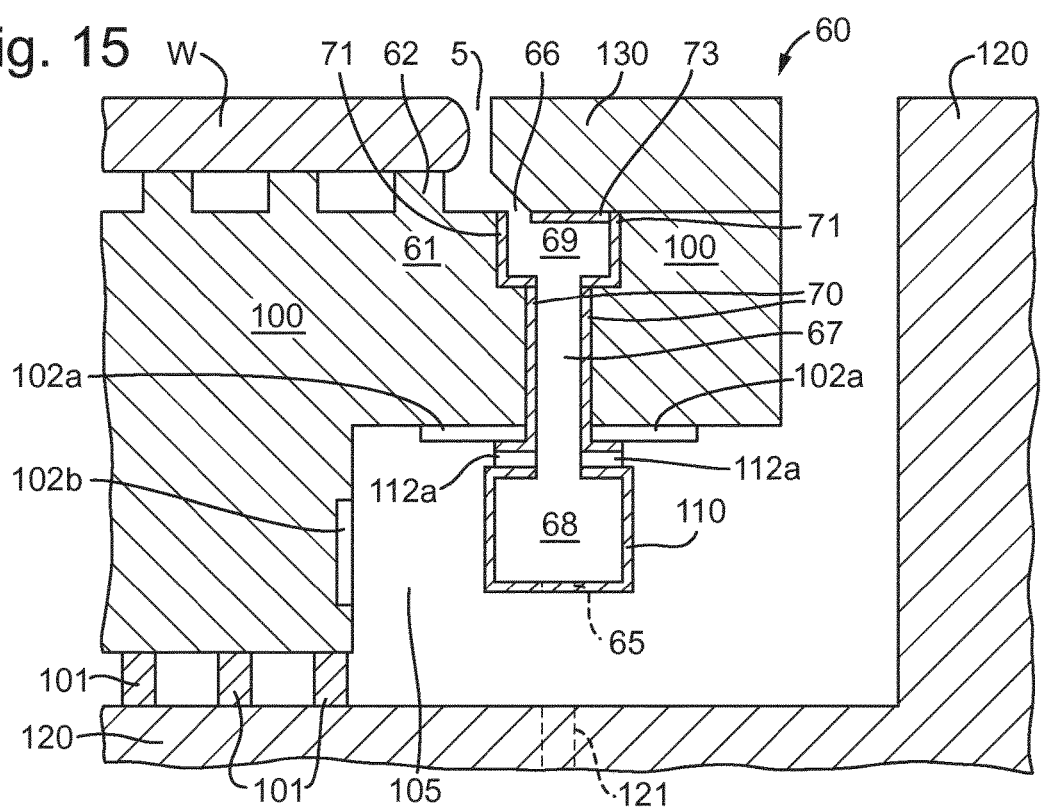

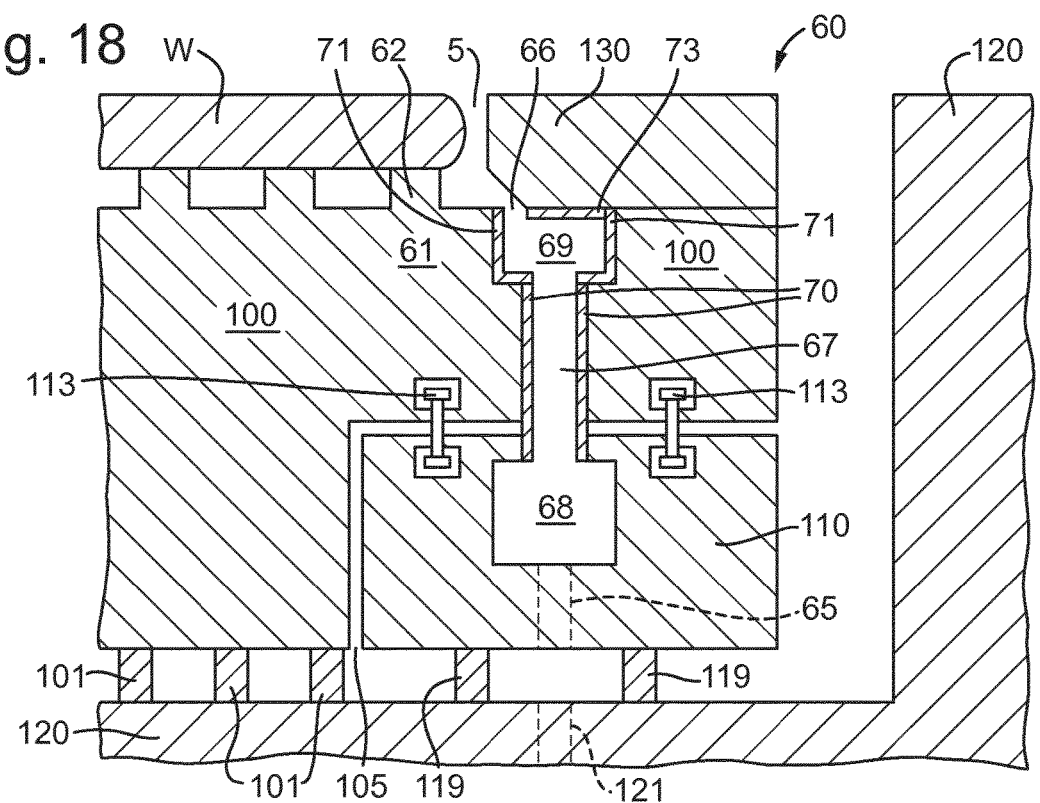
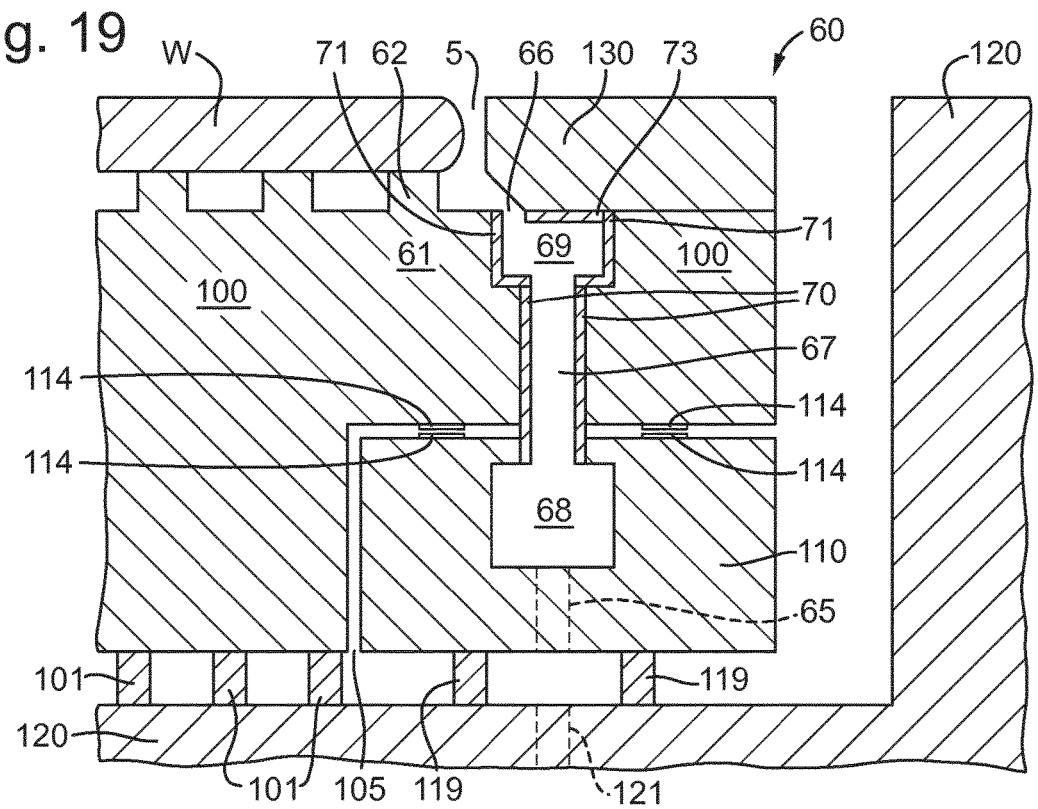

SUPPORT APPARATUS, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2016/064236, which was filed on Jun. 21, 2016, which claims the benefit of priority of European patent application nos. 15173348.2 and 15190337.4, which were filed on Jun. 23, 2015 and Oct. 19, 2015, respectively, and which are each incorporated herein in its entirety by reference.

FIELD

The present invention relates to a support apparatus, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of a projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features because exposure radiation used for transferring the pattern will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and a substrate support apparatus which supports the substrate in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, liquid is used as the immersion fluid. In that case the fluid handling system may be a liquid handling system. In reference to the aforementioned description, reference in this paragraph to a feature defined with respect to fluid may be understood to include a feature defined with respect to liquid.

Handling liquid used for immersion in a lithographic apparatus brings with it one or more problems of liquid handling. A gap normally exists between an object, such as a substrate and/or a sensor, and a support apparatus or table (e.g. a measurement table or a substrate support apparatus, which may comprise a substrate table) around the edge of the object (e.g., substrate and/or sensor). U.S. patent application publication US 2005-0264778 discloses filling that gap with material or providing a liquid source or low pressure source to deliberately fill the gap with liquid in order to avoid bubble inclusion as the gap passes under the fluid handling system and/or to remove any liquid which does enter the gap. Having liquid in the gap and within a channel in the support apparatus can lead to temperature variation in the support apparatus, e.g. between the material surrounding the gap or channel and the rest of the support apparatus. Temperature variation may distort the support apparatus and therefore, the object, which may induce errors in the location of the object.

SUMMARY

It is desirable, for example, to reduce the temperature variation in a support apparatus suitable for use in a lithographic apparatus.

According to an aspect, there is provided a support apparatus configured to support an object, the support apparatus comprising: a support body comprising an object holder to hold an object; an opening in the support body adjacent to an edge of the object holder; a channel in fluid communication with the opening via each of a plurality of passageways in the support body; and a passageway liner mounted in at least one of the plurality of passageways, the passageway liner being thermally insulating substantially to thermally decouple the support body from fluid in the at least one of the plurality of passageways.

According to an aspect, there is provided a method of operating an immersion lithographic apparatus, comprising: providing a liquid onto an object supported by a support body of a support apparatus; and removing liquid from an edge of the object through an opening in the support body, the opening being in fluid communication with a channel via each of a plurality of passageways in the support body, and a passageway liner being mounted in at least one of the plurality of passageways, the passageway liner being thermally insulating substantially to thermally decouple the support body from fluid in the at least one of the plurality of passageways.

According to an aspect, there is provided a device manufacturing method using a lithographic apparatus, the method comprising: projecting a beam patterned by a patterning device onto a substrate while supporting the substrate with a support apparatus, wherein the support apparatus comprises: a support body comprising an object holder to hold the substrate; an opening in the support body adjacent to an edge of the object holder; a channel in fluid communication with the opening via each of a plurality of passageways in the support body; and a passageway liner mounted in at least one of the plurality of passageways, the passageway liner being thermally insulating substantially to thermally decouple the support body from fluid in the at least one of the plurality of passageways.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 6 to 23 depict, in cross-section, a part of a support apparatus of an embodiment of the invention.

DETAILED DESCRIPTION

Figure 1:
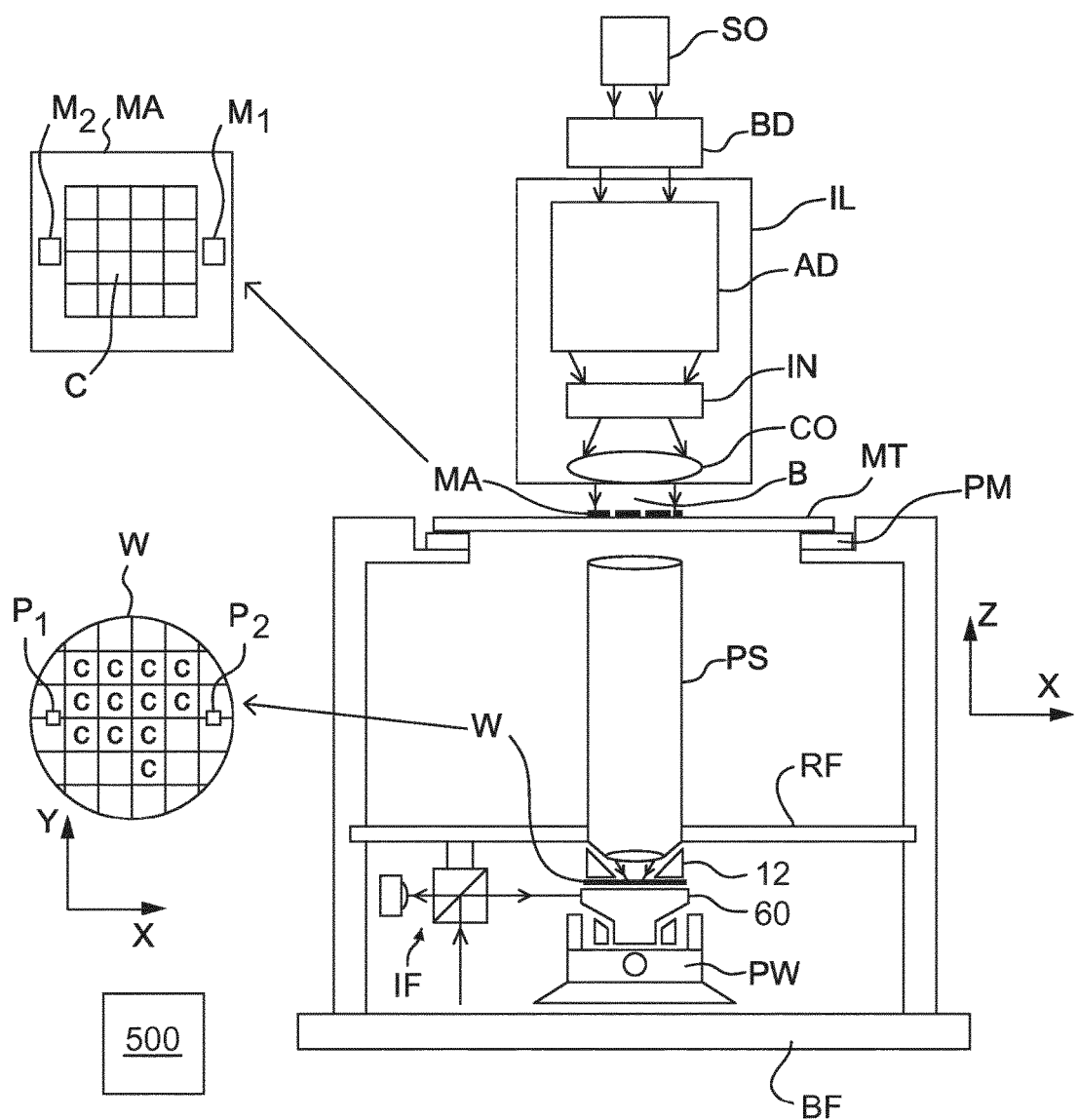
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate support apparatus 60 constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising part of, one, or more dies) of the substrate W.

The illuminator IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage(s) or support apparatus), e.g., two or more substrate support apparatus or a combination of one or more substrate support apparatus and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stage(s) or support(s)) which may be used in parallel in a similar manner to substrate, sensor and measurement tables.

The lithography apparatus is of a type wherein at least a portion of the substrate W may be covered by an immersion liquid 11 having a relatively high refractive index, e.g. water such as ultra pure water (UPW), so as to fill an immersion space 10 between the projection system PS and the substrate W. An immersion liquid 11 may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid 11; rather "immersion" only means that an immersion liquid 11 is located between the projection system PS and the substrate W during exposure. The path of the patterned radiation beam from the projection system PS to the substrate W is entirely through immersion liquid 11.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate support apparatus 60 can be moved accurately, e.g. so as to position different target portions C in the path of the radiation beam B.

Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate support apparatus 60 may be realized using a long-stroke module and a short-stroke module, which form part of the second positioner PW.

In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate support apparatus 60 are kept essentially stationary, while an entire pattern imparted to the radiation beam B is projected onto a target portion C at one time (i.e. a single static exposure). The substrate support apparatus 60 is then shifted in the X and/or Y direction so that a different target portion C can be exposed. In step mode, the maximum size of the exposure field limits the size of the target portion C imaged in a single static exposure.

2. In scan mode, the support structure MT and the substrate support apparatus 60 are scanned synchronously while a pattern imparted to the radiation beam B is projected onto a target portion C (i.e. a single dynamic exposure). The velocity and direction of the substrate support apparatus 60 relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion (and size of the exposure field) determines the height (in the scanning direction) of the target portion C.

3. In another mode, the support structure MT is kept essentially stationary holding a programmable patterning device, and the substrate support apparatus 60 is moved or scanned while a pattern imparted to the radiation beam is projected onto a target portion C. In this mode, generally a pulsed radiation source is employed and the programmable patterning device is updated as required after each movement of the substrate support apparatus 60 or in between successive radiation pulses during a scan. This mode of operation can be readily applied to maskless lithography that utilizes a programmable patterning device, such as a programmable minor array of a type as referred to above.

Combinations and/or variations on the above described modes of use or entirely different modes of use may also be employed.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an embodiment the controller operates the apparatus to perform an embodiment of the present invention. In an embodiment the controller 500 has a memory to store the results of a step one described herein for later use in a step two.

Arrangements for providing immersion liquid between a final optical element of the projection system PS and the substrate can be classed into three general categories. These are the bath type arrangement, the so-called localized immersion systems and the all-wet immersion systems. An embodiment of the present invention relates particularly to the localized immersion systems.

Figure 2:
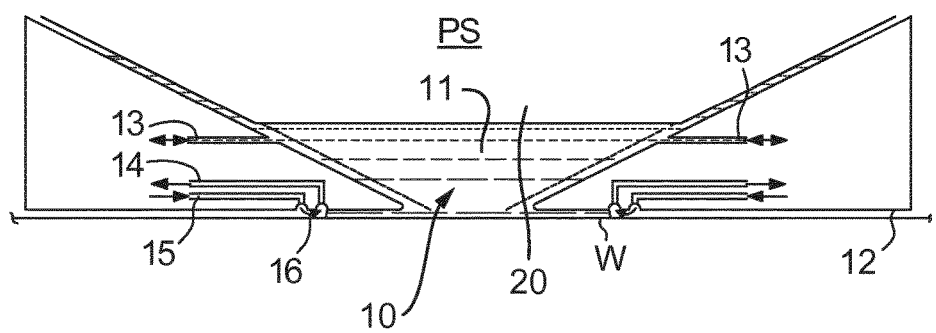
FIG. 2 depicts a liquid supply system for use in a lithographic projection apparatus.

In an arrangement which has been proposed for a localized immersion system a liquid confinement structure 12 extends along at least a part of a boundary of an immersion space 10 between the final optical element 20 of the projection system PS and the facing surface of the stage or table facing the projection system PS. The facing surface of the table is referred to as such because the table is moved during use and is rarely stationary. Generally, the facing surface of the table is a surface of a substrate W and/or a surface of the substrate support apparatus which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 20 of the projection system PS and the substrate support apparatus 60 or substrate W. In an embodiment, a seal is formed between the liquid confinement structure 12 and the surface of the substrate W/substrate support apparatus 60. The seal may be a contactless seal such as a gas seal 16 (such a system with a gas seal is disclosed in European patent application publication no. EP-A-1,420,298) or an immersion liquid seal.

The liquid confinement structure 12 is configured to supply and confine immersion liquid 11 to the immersion space 10 Immersion liquid 11 is brought into the immersion space 10 through one of liquid openings 13. The immersion liquid 11 may be removed through another of liquid openings 13. The immersion liquid 11 may be brought into the immersion space 10 through at least two liquid openings 13. Which of liquid openings 13 is used to supply immersion liquid 11 and optionally which is used to remove immersion liquid 11 may depend on the direction of motion of the substrate support apparatus 60.

Immersion liquid 11 may be contained in the immersion space 10 by the gas seal 16 which, during use, is formed between the bottom of the liquid confinement structure 12 and the facing surface of the table (i.e. the surface of the substrate W and/or the surface of the substrate support apparatus 60). The gas in the gas seal 16 is provided under pressure via gas inlet 15 to a gap between the liquid confinement structure 12 and substrate W and/or substrate support apparatus 60. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion liquid 11. The force of the gas on the immersion liquid 11 between the liquid confinement structure 12 and the substrate W and/or substrate support apparatus 60 contains the immersion liquid 11 in the immersion space 10. A meniscus forms at a boundary of the immersion liquid 11. Such a system is disclosed in United States patent application publication no. US 2004-0207824. Other immersion liquid confinement structures 12 can be used with embodiments of the present invention.

Figure 3:
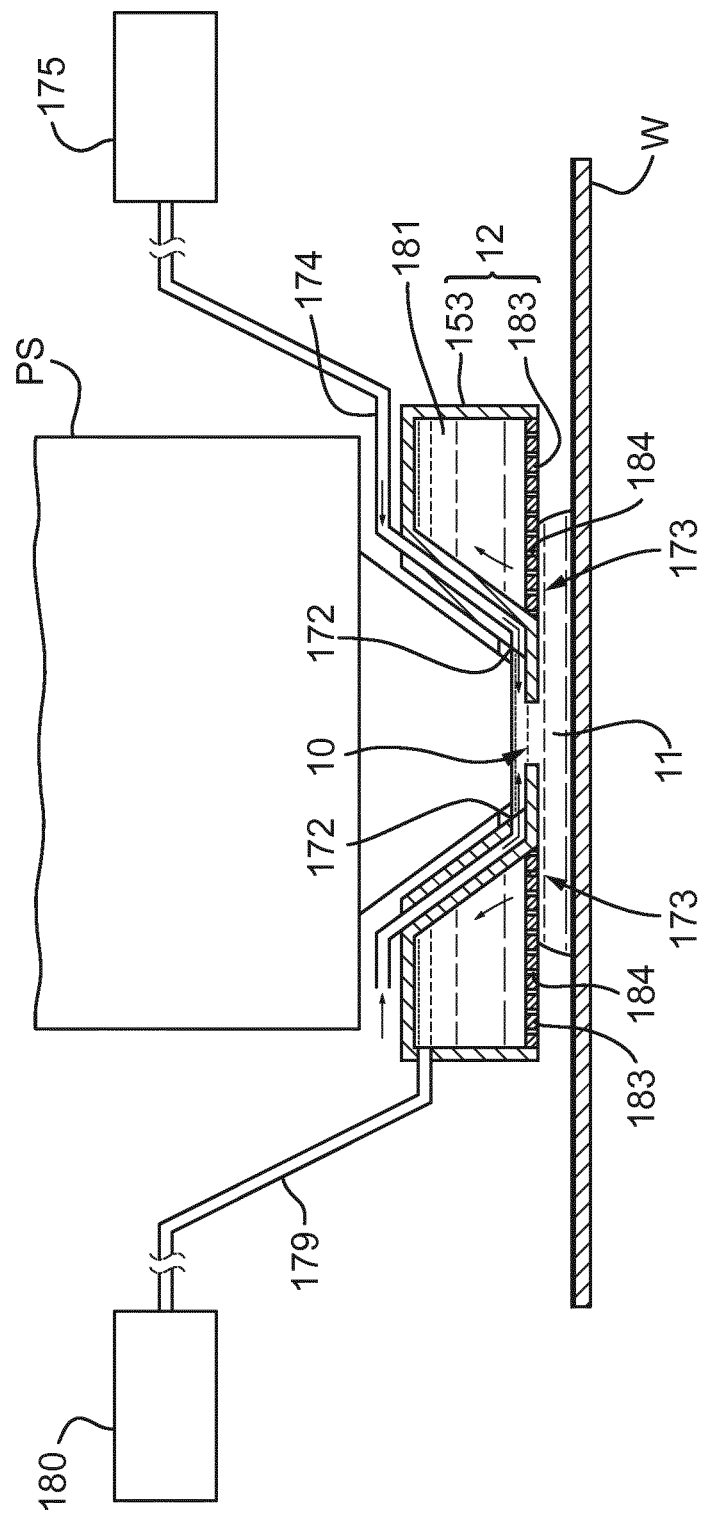
FIG. 3 depicts a further liquid supply system for use in a lithographic projection apparatus.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a liquid confinement structure 12, which extends along at least a part of a boundary of the space between the final element of the projection system PS and the substrate support apparatus 60 or substrate W. (Reference in the following text to surface of the substrate W also refers in addition or in the alternative to a surface of the substrate support apparatus 60, unless expressly stated otherwise.)

The liquid confinement structure 12 at least partly contains immersion liquid 11 in the immersion space 10 between the final element of the projection system PS and the substrate W and/or substrate support apparatus 60. The immersion space 10 is at least partly formed by the liquid confinement structure 12 positioned below and surrounding the final element of the projection system PS. In an embodiment, the liquid confinement structure 12 comprises a main body member 153 and a porous member 183. The porous member 183 is plate shaped and has a plurality of holes 184 (i.e., openings or pores). In an embodiment, the porous member 183 is a mesh plate wherein numerous small holes 184 are formed in a mesh. Such a system is disclosed in United States patent application publication no. US 2010/0045949 A1.

The main body member 153 comprises one or more supply ports 172, which are capable of supplying the immersion liquid 11 to the immersion space 10, and a recovery port 173, which is capable of recovering the immersion liquid 11 from the immersion space 10. The one or more supply ports 172 are connected to a liquid supply apparatus 175 via a passageway 174. The liquid supply apparatus 175 is capable of supplying the immersion liquid 11 to the one or more supply ports 172. The immersion liquid 11 that is fed from the liquid supply apparatus 175 is supplied to the one or more supply ports 172 through the corresponding passageway 174. The one or more supply ports 172 are disposed in the vicinity of the optical path at a respective prescribed position of the main body member 53 that faces the optical path. The recovery port 173 is capable of recovering the immersion liquid 11 from the immersion space 10. The recovery port 173 is connected to a liquid recovery apparatus 180 via a passageway 179. The liquid recovery apparatus 180 comprises a vacuum system and is capable of recovering the immersion liquid 11 by sucking it via the recovery port 173. The liquid recovery apparatus 180 recovers the immersion liquid 11 recovered via the recovery port 173 through the passageway 179. The porous member 183 is disposed in the recovery port 173.

In an embodiment, to form the immersion space 10 with the immersion liquid 11 between the projection system PS and the liquid confinement structure 12 on one side and the substrate W on the other side, immersion liquid 11 is supplied from the one or more supply ports 172 to the immersion space 10 and the pressure in a recovery chamber 181 in the liquid confinement structure 12 is adjusted to a negative pressure so as to recover the immersion liquid 11 via the holes 184 (i.e., the recovery port 173) of the porous member 183. Performing the liquid supply operation using the one or more supply ports 172 and the liquid recovery operation using the porous member 183 forms the immersion space 10 between the projection system PS and the liquid confinement structure 12 and the substrate W.

Figure 4:
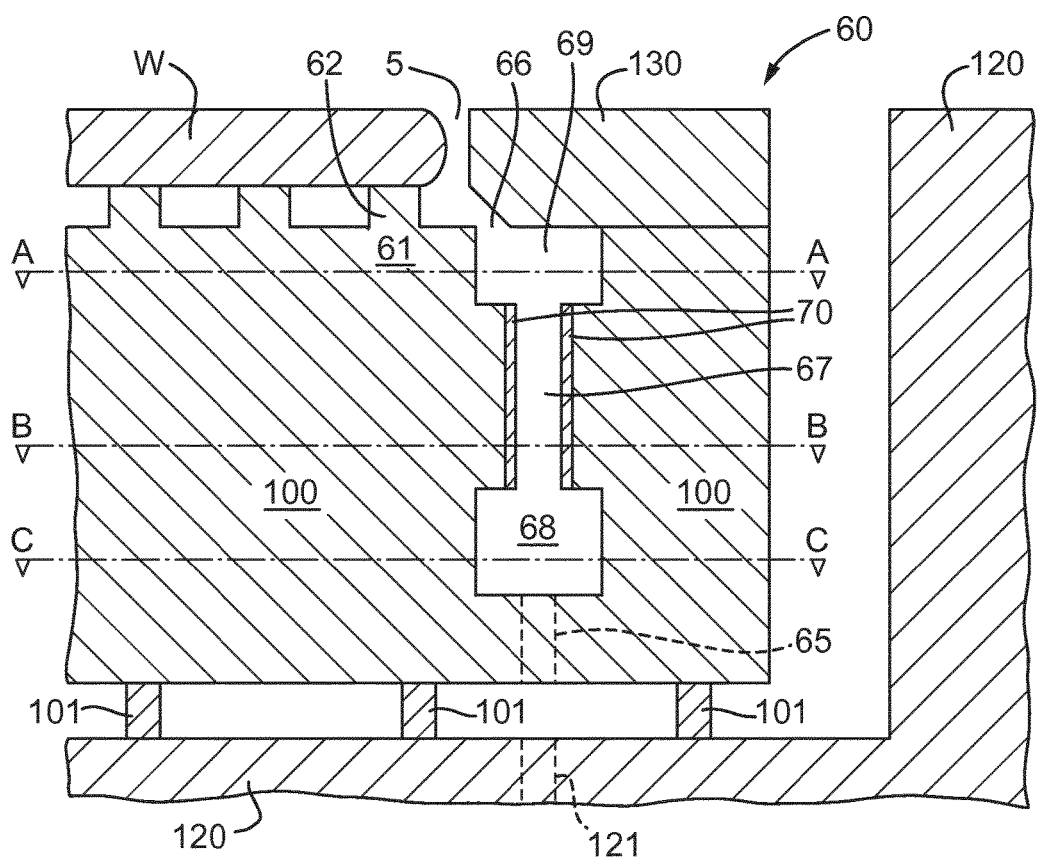
FIG. 4 depicts, in cross-section, a part of a support apparatus of an embodiment of the invention.

FIG. 4 depicts an embodiment of the present invention. FIG. 4 depicts a cross section through a support apparatus and an object. The support apparatus is configured to support the object. The support apparatus comprises a support body, the support body comprising an object holder to hold the object. In FIG. 4, the support apparatus is depicted with support body 100. In an embodiment, the object holder may be the part of the support body 100 which is holding the object. In an embodiment, as in FIG. 4, the object is a substrate W, the support apparatus is a substrate support apparatus 60 and the object holder is a substrate holder 61.

As depicted in FIG. 4, the substrate W is held by the substrate holder 61. The substrate holder 61 may be the upper portion of the support body 100. The substrate holder 61 is configured to hold the substrate W, for example, in an embodiment, the substrate holder 61 may comprise one or more projections 62 which project from the support body 100 (e.g. burls). The substrate holder 61 may be referred to as a pimple table.

When the edge of the substrate W is being imaged or at other times when the substrate W moves under the projection system PS, the liquid in the space 11 will pass at least partly over a gap 5 at the edge of the substrate W. In FIG. 4, the gap 5 is depicted between the substrate W and an edge of a cover ring 130. This can result in liquid in the space 11 entering the gap 5. The cover ring 130 may form a top surface of the substrate support apparatus 60, which may be approximately level with the top surface of the substrate W.

An under pressure applied between the substrate W and the substrate holder 61 helps ensure that the substrate W is held firmly in place. However, if liquid gets between the substrate W and the substrate holder 61, this can lead to difficulties, especially when unloading the substrate W.

The substrate support apparatus 60 is configured to extract fluid from a top surface of the substrate support apparatus 60 via the gap 5. However, providing a gap 5 can result in bubbles of gas entering the liquid in the space 11. If gas escapes from the gap 5 into the liquid in the space 11, this can lead to a bubble which floats within the liquid. If such a bubble is in a path of the radiation beam B, it may lead to imaging errors. One or more of such bubbles can deleteriously affect the imaging of the substrate W.

Therefore, an opening 66 may be provided to remove gas from the gap 5 at the edge of the substrate W as depicted in FIG. 4. Removing gas from the gap 5 using such an opening 66 may reduce the number or size of bubbles of gas that may enter the liquid in the space 11 from the gap 5. The opening 66 may be referred to as an extraction opening. The opening 66 may be in fluid communication with the gap 5.

In an embodiment, the opening 66 is in the support body 100 adjacent to an edge of the substrate holder 61. In an embodiment, the substrate support apparatus 60 comprises a channel 68 in fluid communication with the opening 66 via a passageway 67 in the support body 100, as depicted in FIG. 4. There may be a plurality of passageways 67, and the channel 68 may be in fluid communication with the opening 66 via each of the plurality of passageways 67. The channel 68 may elongate, in plan. In an embodiment the channel 68 substantially surrounds, in plan, the object holder 61. The channel 68 may be used to remove fluid from the substrate support apparatus 60. The channel 68 may be connected to an under pressure so as to extract fluid through the opening 66 from the gap 5 in the substrate support apparatus 60.

Gas is mostly extracted through opening 66 (for example, between about 5 and 100 normal liters per minute (Nl/min)) and only a small amount of liquid is extracted through opening 66 (for example, between about 1 to 100 ml/min, and optionally 10 to 20 ml/min). With such a two-phase flow, the liquid evaporates, cooling down the support body 100 around the passageway 67, i.e. surrounding the edge of the substrate W. Variations in temperature (i.e. thermal variation) of the support body 100 may result in deformation of the support body 100, and consequently, this may result in deformation of the substrate W. Deformation of the substrate W may eventually lead to decreased overlay performance. Therefore, it is advantageous to reduce thermal variation of the support body 100.

To address these issues, in the present invention, a passageway liner 70 is mounted in at least one of the plurality of passageways 67. The passageway liner 70 is thermally insulating substantially to thermally decouple the support body 100 from fluid in the at least one of the plurality of passageways 67. By providing such a passageway liner 70, thermal variation of support body 100 can be reduced. In particular, an effect of cooling down the support body 100 due to fluid in the passageway 67 is reduced. As mentioned above, cooling can occur due to evaporation of the two-phase flow in the passageway 67. Additionally, there may be a temperature difference between the two-phase flow in the passageway 67 and the surrounding support body 100. Therefore, thermally decoupling the support body 100 from the fluid in the passageway 67 reduces or prevents any thermal effect of the fluid in the passageway 67 on the support body 100.

Thermally decoupling may mean that the passageway 67 is thermally isolated, indicating that the passageway liner 70 is effective at all frequencies and reduces or prevents the transfer of heat to or from the passageway 67 to the support body 100. Additionally or alternatively, thermal decoupling can include heat buffering, which is effective at frequencies above a threshold frequency and may mean that any rapid temperature variation of fluid in the passageway 67 will take longer to reach the support body 100 which allows time for such rapid thermal variations to be accounted for, for example, by heaters in the support body. Overall, the thermal decoupling can reduce or prevent thermal cross-talk between fluid in the passageway 67 and the support body 100.

In an embodiment, the passageway liner 70 is a tube which is mounted in at least one of the plurality of passageways 67. For example, the passageway liner 70 may be mounted from the top-side of the support body 100 in at least one of the plurality of passageways 67 before the cover ring 130 is installed. In an embodiment, the passageway liner 70 is inserted in the passageway 67 in the support body 100. In an embodiment, the passageway liner 70 is mounted inside the passageway 67 by forming layers of a material to form the passageway liner 70 inside the passageway 67. In an embodiment, the passageway liner 70 may be mounted inside the passageway 67 by spraying a liquid material into the passageway 67 which may solidify to form the passageway liner 70. The passageway liner 70 may be formed using a 3-D printer and then mounted inside the support body 100. The passageway liner 70 may be formed by extending the passageway liner 70, for example to form a polymer tube, which may be inserted into at least one of the plurality of passageways 67. The passageway liner 70 may be formed by casting and curing a liquid material, for example liquid PTFE, in the passageway 67 and processing the material, once solidified, to form the passageway liner 70 in the at least one of the plurality of passageways 62. Processing may include drilling and/or milling.

In an embodiment, the passageway liner 70 has a thickness (i.e. the radial width of the walls defining the tube) of at least 0.2 mm. In an embodiment, the passageway liner 70 has a thickness of at least 0.5 mm. In an embodiment, the passageway liner 70 has a thickness of at least 1.0 mm. The passageway liner 70 having at least these thicknesses may improve the thermal insulation provided by the passageway liner 70. The thicknesses provided may be the minimum thickness of any portion of the passageway liner 70. The thickness of the passageway liner 70 may be uniform, i.e. the passageway liner 70 may have substantially the same thickness around the inside of the passageway 67, circumferentially and/or in an axial direction through the passageway 67. In this instance, substantially the same thickness may mean within 10% of the desired thickness, for example 0.2 mm±0.02 mm.

In an embodiment, the passageway liner 70 is made of a material selected substantially to thermally decouple the support body 100 from fluid in the passageway 67. Therefore, the material of the passageway liner 70 is selected to reduce or prevent heat transfer between the fluid in the passageway 67 and the support body 100. Thus at least one of the passageways 67 is isolated using a passageway liner 70 formed using material with a low thermal conductivity. In an embodiment, the passageway liner 70 is made of a material having a thermal conductivity of less than or equal to about 0.5 W/mK at 25° C., preferably less than or equal to 0.1 W/mK at 25° C., or more preferably less than or equal to about 0.05 W/mK at 25° C. In an embodiment, the passageway liner 70 is made of a material having a thermal conductivity of greater than or equal to 0.01 W/mK at 25° C., or greater than or equal to 0.02 W/mK at 25° C., or at 25° C. greater than or equal to 0.03 W/mK at 25° C. In an embodiment the passageway liner 70 is made of a material having a thermal conductivity of approximately 0.01 to 0.5 W/mK at 25° C., preferably approximately 0.02 to 0.1 W/mK at 25° C., or more preferably approximately 0.03 to 0.05 W/mK at 25° C.

Providing a passageway liner 70 with low thermal conductivity as described may have the advantage that heat conductance of the passageway liner 70 is relatively poor compared to materials used for the surrounding support body 100 and other components of the substrate support apparatus 60. Therefore, the passageway liner 70 may have significant heat-resistance compared to surrounding components or parts of the substrate support apparatus 60. As such, a temperature load, for example, as a result of evaporation described above or due to a difference in temperature between the fluid in the passageway 67 and the surrounding support body 100, will have a reduced effect on the surrounding support body 100.

In an embodiment, the passageway liner 70 is made of polytetrafluoroethylene (PTFE), e.g. Teflon®, which has a thermal conductivity of approximately 0.25 W/mK at 25° C. In an embodiment, the passageway liner 70 is made of high-density polyethylene (HDPE), which has a thermal conductivity of approximately 0.45 W/mK at 25° C. In an embodiment, the passageway liner 70 is made of polypropylene (PP), which has a thermal conductivity of approximately 0.15 W/mK at 25° C. In an embodiment, the passageway liner 70 is made of polyvinyl chloride (PVC), which has a thermal conductivity of approximately 0.19 W/mK at 25° C. In an embodiment, the passageway liner 70 is made of rubber, which has a thermal conductivity of approximately 0.13 W/mK at 25° C. In an embodiment, the passageway liner 70 is made of cork, which has a thermal conductivity of approximately 0.07 W/mK at 25° C. In an embodiment, the passageway liner 70 is made of Viton®, which has a thermal conductivity of approximately 0.19-30 W/mK at 25° C. In an embodiment, the passageway liner 70 is made using two or more of the above-mentioned materials. Other materials may be used for the passageway liner 70.

In an embodiment, the passageway liner 70 is made of a material having a specific heat capacity ($c_p$) greater than or equal to about 0.8 kJ/kg.k, or preferably greater than or equal to about 1.0 kJ/kg.k, or more preferably greater than or equal to about 1.5 kJ/kg.k. In an embodiment, the passageway liner 70 is made of a material having a specific heat capacity ($c_p$) less than or equal to 4.0 kJ/kg.k, or less than or equal to 3.5 kJ/kg.k, or less than or equal to 3.0 kJ/kg.k. In an embodiment, the passageway liner 70 is made of a material having a specific heat capacity ($c_p$) of approximately 0.8 to 4.0 kJ/kg.k, or preferably, approximately 1.0 to 3.5 kJ/kg.k, or more preferably, approximately 1.5 to 3.0 kJ/kg.k. The specific heat capacity ($c_p$) is the isobaric specific heat capacity at approximately 25° C.

In an embodiment, the material used for the passageway liner 70 is selected to have a hydrophobic surface in the passageway 67 i.e. the passageway liner 70 is formed of a hydrophobic material. In an embodiment, the passageway liner 70 has a hydrophobic layer on an inner surface of the passageway liner 70 to repel liquid. Having a hydrophobic surface on the inner surface of the passageway liner 70 may be advantageous in removing more efficiently liquid from inside the passageway 67 into the channel 68. This is because liquid on the hydrophobic surface of the passageway liner 70 is more likely to form droplets with an increased contact angle on the hydrophobic surface and are therefore, more likely to move more quickly from the surface of the passageway liner 70 to the channel 68. For example, the material used on the inner surface of the passageway liner (i.e. as a material layer or the material for forming the passageway liner 70) has a contact angle with water of approximately 90°-160°, or preferably approximately 100°-140°; or approximately 110°-120°. The contact angle being the angle measured between the surface and an edge of a liquid droplet on the surface, the angle being measured through the droplet. This may be advantageous, because this may reduce the amount of liquid which evaporates in the passageway 67, which is one of the causes of thermal variation in the support body 100. Additionally, this means that liquid may be removed more quickly from the passageway 67, such that temperature difference between the fluid and the surrounding support body 100 will generally have less effect due to the liquid being present for a shorter time period. In an embodiment, the hydrophobic surface may be formed using any material with a suitable contact angle, for example, PTFE or PP.

In an embodiment, the passageway liner 70 is a structural element, for example, a self-supporting structural element which does not require a support to avoid bending under self weight. In an embodiment, the passageway liner 70 is not a coating. A coating is not a self supporting structural element as herein defined. In an embodiment, a portion of the passageway liner 70 may extend out of the support body 100. In an embodiment, the portion of the passageway liner 70 does not require any additional support (e.g. to be surrounded by the support body 100) because the passageway liner 70 is made of a material and design such that it can support itself substantially without deflection.

Figure 5A:
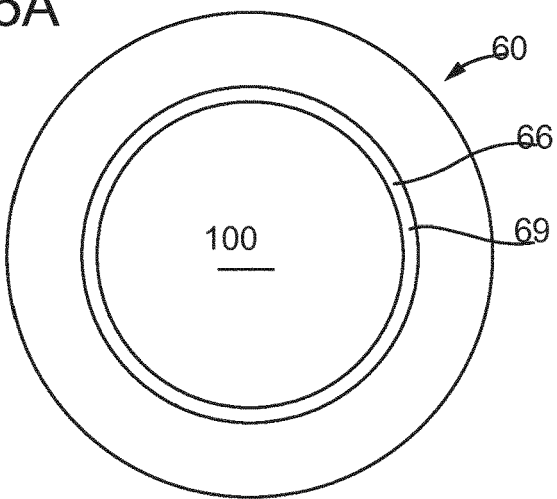
FIGS. 5A-C depict, in plan view, the support apparatus of FIG. 4.
Figure 5B:
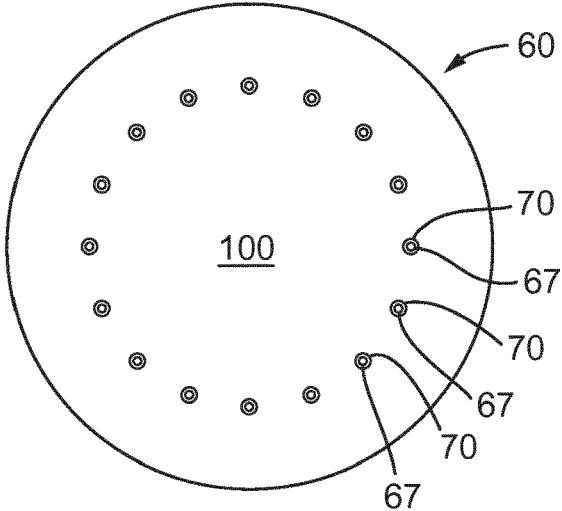
Figure 5C:
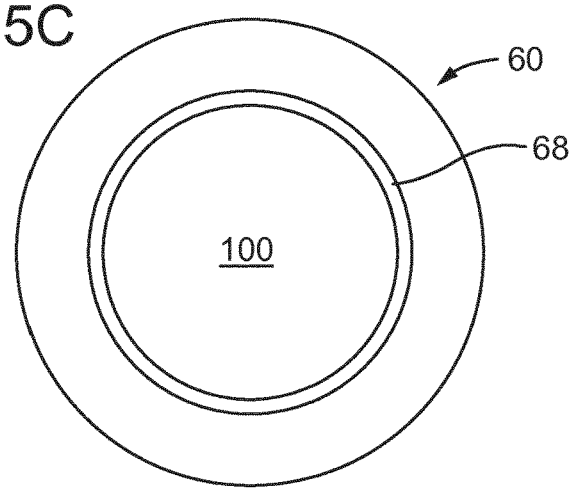

The support body 100 may have a plurality of passageways 67 which are in fluid communication with the opening 66 and the channel 68. FIGS. 5A, 5B and 5C show an exemplary embodiment of this configuration by showing cross-sections, in plan view, of FIG. 4.

FIG. 5A shows the cross section labelled A-A in FIG. 4. FIG. 5A shows an embodiment in which the opening 66 of FIG. 4 is continuous around the support body 100. In other words, the opening 66 forms an unbroken path around the support body 100. Continuous does not require the opening 66 to have the same dimensions around the support body 100. The opening 66 is shown as a circular path, however, it may have another shape.

FIG. 5B shows the cross section labelled B-B in FIG. 4. The plurality of passageways 67 are discrete passageways in plan view as shown in FIG. 5B. Therefore, each passageway 67 extends between the opening 66 and the channel 68. In an embodiment, some of the passageways 67 may be connected to each other via additional pathways not shown. FIG. 5B shows that each and every one of the passageways 67 have a passageway liner 70 (although not all of the passageways 67 and passageway liners 70 are labelled). In an embodiment, only one passageway 67 may have a passageway liner 70. In an embodiment, multiple passageways 67 have a passageway liner 70, but not every passageway 67. FIG. 5B shows 16 passageways 67 in the support body 100. In an embodiment, there are more than 16 passageways 67. In an embodiment, there are 64 passageways 67. In an embodiment, there are more than 64 passageways 67, for example, there may be up to 150 passageways. The number of passageways 67 is not particularly limiting.

FIG. 5C shows the cross section labelled C-C in FIG. 4. FIG. 5C shows an embodiment in which the channel 68 of FIG. 4 is continuous around the support body 100. In an embodiment, the channel 68 forms an unbroken path around the support body 100. Continuous does not require the channel 68 to have the same dimensions around the support body 100. The channel 68 is shown as a circular path, however, it may have another shape.

In an embodiment, the material used for the support body 100 has a Young's modulus greater than or equal to approximately 50 GPa, or preferably greater than or equal to approximately 200 GPa, or more preferably greater than or equal to approximately 300 GPa. In an embodiment, the material used for the support body 100 has a Young's modulus of less than or equal to approximately 500 GPa, or less than or equal to approximately 450 GPa, or less than or equal to approximately 400 GPa. In an embodiment, the material used for the support body 100 has a Young's modulus of approximately 50-500 GPa, or preferably approximately 200-450 GPa, or more preferably approximately 300-400 GPa. In an embodiment, the material used for the support body 100 is siliconized silicon carbide (SiSiC), silicon carbide, aluminum, quartz, titanium or aluminum nitride. In an embodiment, the support body 100 is made from more than one material.

In an embodiment, the substrate support apparatus 60 of any of the above embodiments may optionally further comprise an object table 120. The object table 120 may otherwise be referred to as a substrate table. In an embodiment, the support body 100 is positioned within a recess of the object table 120, as depicted in FIGS. 4 and 6-15.

In an embodiment, the support body 100 further comprises at least one drainage channel 65 which allows fluid in the channel 68 to exit the support body 100. In an embodiment, the drainage channel 65 allows fluid to exit the support body 100 and pass into an extraction channel 121 in the object table 120. Multiple drainage channels 65 may be provided as a plurality of openings or passages on a base of the channel 68.

As depicted in FIG. 4, the support body 100 may further comprise support body connectors 101. The support body connectors 101 may be part of the support body 100 or the support body connectors 101 may be attached to the support body 100, for example, using an adhesive. In an embodiment, the support body 100 is connected to the object table 120 by the support body connectors 101. The support body connectors 101 may otherwise be referred to as burls. The support body connectors 101 allow acceleration forces to be transferred from the object table 120 to the support body 100. Providing gaps between the support body connectors 101 reduces thermal transfer between the object table 120 and the support body 100.

The support body connectors 101 are optional. The support body connectors 101 may be replaced with a direct interface between a bottom surface of the support body 100 and the object table 120. In an embodiment, the support body 100 of the substrate support apparatus 60 may additionally or alternatively be connected to the object table 120 by vacuum clamping, bolting, an adhesive and/or kinematic leaf spring connectors. The form of the connection between the support body 100 and the object table 120 is not limiting.

Figure 6:
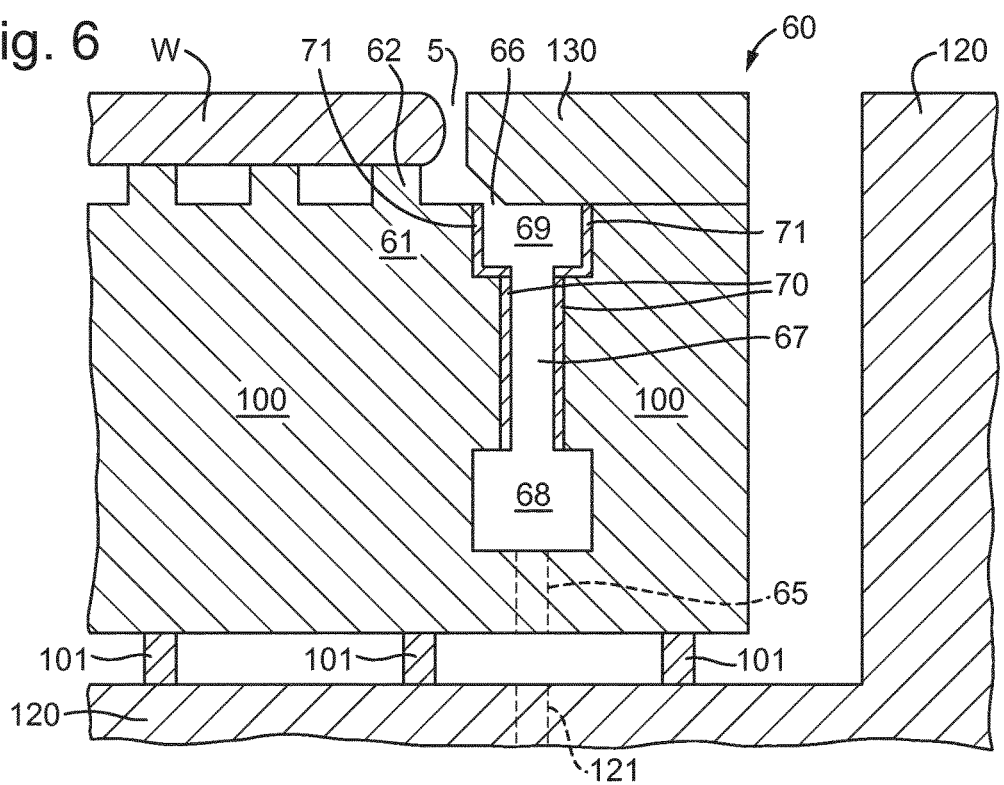

In any of the above embodiments, the opening 66 may be defined by an opening groove 69 in the support body 100. The opening 66 may be defined by the top of the opening groove 69. The opening 66 may be defined by an opening into the opening groove 69. The opening 66 allows fluid to enter the opening groove 69. The size of the opening 66 may be reduced by the cover ring 130, such that the opening 66 is as depicted in FIGS. 4 and 6 to 15 in which the opening 66 allows fluid to pass from the gap 5 to the opening groove 69. The opening groove 69 is depicted in FIG. 6. The opening groove 69 may form an edge of the substrate holder 61 of the support body 100. The opening groove 69 is in fluid communication with the passageway 67. The opening groove 69 may be directly connected to the passageway 67. The opening groove 69 may be a similar width to the passageway 67. The opening groove 69 may be slightly wider than the width of the passageway 67. The opening groove 69 and the passageway 67 may be continuous from each other, but may be distinguished from each other by a variation in diameter.

In an embodiment, an opening liner 71 is mounted in the opening groove 69. In an embodiment, the opening liner 71 is inserted into the support body 100. In an embodiment, the opening liner 71 is mounted inside the opening groove 69 by forming layers of a material to form a liner inside the passageway. In an embodiment, the opening liner 71 may be mounted inside the opening groove 69 by spraying a liquid material into the opening groove 69 which may solidify to form the opening liner 71. The opening liner 71 may be formed using a 3-D printer and then inserted inside the support body 100. The opening liner 71 may be formed by extrusion. The opening liner 71 may be formed by casting and curing a liquid material, for example liquid PTFE, in the opening groove 69 and processing the material once solidified to form the opening liner 71. Processing may include milling and/or drilling. In an embodiment, the opening groove 69 and/or the opening liner 71 is substantially U-shaped in cross-section. In an embodiment, the opening groove 69 and/or the opening liner 71 is substantially V-shaped i.e. tunnel-shaped in cross-section. The shape of the opening groove 69 and/or the opening liner 71 is not limiting.

In an embodiment, the opening liner 71 has a thickness (i.e. the width of the walls defining the opening liner 71) of at least 0.2 mm. In an embodiment, the opening liner 71 has a thickness of at least 0.5 mm. In an embodiment, the opening liner 71 has a thickness of at least 0.1 mm. The opening liner 71 having at least these thicknesses may improve the thermal insulation provided by the opening liner 71. The thicknesses provided may be the minimum thickness of any portion of the opening liner 71. The thickness of the opening liner 71 may be uniform, i.e. the opening liner 71 may have substantially the same thickness around the inside of the opening groove 69. In this instance, substantially the same thickness may mean within 10% of the desired thickness, for example 0.2 mm±0.02 mm.

In an embodiment, the opening liner 71 is made of a material selected substantially to thermally decouple the support body 100 from fluid in the opening groove 69. Therefore, the material of the opening liner 71 is selected to reduce or prevent heat transfer between the fluid in the opening groove 69 and the support body 100. Thus the opening groove 69 may be isolated using an opening liner 71 formed using material with a low thermal conductivity. In an embodiment, the opening liner 71 is made of a material having a thermal conductivity of less than or equal to about 0.5 W/mK at 25° C., preferably less than or equal to 0.1 W/mK at 25° C., or more preferably less than or equal to about 0.05 W/mK at 25° C. In an embodiment, the opening liner 71 is made of a material having a thermal conductivity of greater than or equal to 0.01 W/mK at 25° C., or greater than or equal to 0.02 W/mK at 25° C., or at 25° C. greater than or equal to 0.03 W/mK at 25° C. In an embodiment the opening liner 71 is made of a material having a thermal conductivity of approximately 0.01 to 0.5 W/mK at 25° C., preferably approximately 0.02 to 0.1 W/mK at 25° C., or more preferably approximately 0.03 to 0.05 W/mK at 25° C. Providing an opening liner 71 with low thermal conductivity as described may have the advantage that heat conductance of the opening liner 71 is relatively poor compared to materials used for the surrounding support body 100 and other components of the substrate support apparatus 60. Therefore, the opening liner 71 may have significant heat-resistance compared to surrounding components or parts of the substrate support apparatus 60. As such, a temperature load, for example, as a result of evaporation described above or due to a difference in temperature between the fluid in the opening groove 69 and the surrounding support body 100, will have a reduced effect on the surrounding support body 100.

In an embodiment, the opening liner 71 is made of polytetrafluoroethylene (PTFE e.g. Teflon®), which has a thermal conductivity of approximately 0.25 W/mK at 25° C. In an embodiment, the opening liner 71 is made of high-density polyethylene (HDPE), which has a thermal conductivity of approximately 0.45 W/mK at 25° C. In an embodiment, the opening liner 71 is made of polypropylene (PP), which has a thermal conductivity of approximately 0.15 W/mK at 25° C. In an embodiment, the opening liner 71 is made of polyvinyl chloride (PVC), which has a thermal conductivity of approximately 0.19 W/mK at 25° C. In an embodiment, the opening liner 71 is made of rubber, which has a thermal conductivity of approximately 0.13 W/mK at 25° C. In an embodiment, the opening liner 71 is made of cork, which has a thermal conductivity of approximately 0.07 W/mK at 25° C. In an embodiment, the opening liner 71 is made of Viton®, which has a thermal conductivity of approximately 0.19-30 W/mK at 25° C. Other materials may be used for the opening liner 71. In an embodiment, the opening liner 71 is made using two or more of the above-mentioned materials.

In an embodiment, the opening liner 71 is made of a material having a specific heat capacity ($c_p$) greater than or equal to about 0.8 kJ/kg.k, or preferably greater than or equal to about 1.0 kJ/kg.k, or more preferably greater than or equal to about 1.5 kJ/kg.k. In an embodiment, the opening liner 71 is made of a material having a specific heat capacity ($c_p$) less than or equal to 4.0 kJ/kg.k, or less than or equal to 3.5 kJ/kg.k, or less than or equal to 3.0 kJ/kg.k. In an embodiment, the opening liner 71 is made of a material having a specific heat capacity ($c_p$) of approximately 0.8 to 4.0 kJ/kg.k, or preferably, approximately 1.0 to 3.5 kJ/kg.k, or more preferably, approximately 1.5 to 3.0 kJ/kg.k. The specific heat capacity ($c_p$) is the isobaric specific heat capacity at approximately 25° C.

In an embodiment, the material used for the opening liner 71 is selected to have a hydrophobic surface in the opening groove 69, i.e. the opening liner 71 is formed of a hydrophobic material. In an embodiment, the opening liner 71 has a hydrophobic layer on the inner surface of the opening liner 71 to repel liquid. Having a hydrophobic surface on the inner surface of the opening liner 71 may be advantageous in removing more efficiently liquid from inside the opening groove 69 into the channel 68. This is because liquid on the hydrophobic surface of the opening liner 71 is more likely to form droplets with an increased contact angle on the hydrophobic surface and are therefore, more likely to move more quickly from the opening groove 69 to the passageway 67 and as such, towards the channel 68. For example, the material used on the inner surface of the opening liner 71 (i.e. as a material layer or for the material forming the opening liner 71) has a contact angle with water of approximately 90°-160°, or preferably approximately 100°-140°; or more preferably approximately 110°-120°. The contact angle being the angle measured between the surface and an edge of a liquid droplet on the surface, the angle being measured through the droplet. This may be advantageous, because this may reduce the amount of liquid which evaporates in the opening groove 69, which is one of the causes of thermal variation in the support body 100. Additionally, this means that liquid may be removed more quickly to the channel 68, such that temperature difference between the fluid and the surrounding support body 100 will generally have less effect due to the liquid being present for a shorter time period. In an embodiment, the hydrophobic surface may be formed using any material with a suitable contact angle, for example, PTFE or PP.

In an embodiment, the opening liner 71 is a structural element, for example, a self-supporting structural element which does not require a support to avoid bending under self weight. In an embodiment, the opening liner 71 is not a coating. A coating is not a self-supporting structural element as herein defined. In an embodiment, a portion of the opening liner 71 may extend out of the support body 100. In an embodiment, the portion of the opening liner 71 does not require any additional support (e.g. to be surrounded by the support body 100) because the opening liner 71 is made of a material and design such that it can support itself substantially without deflection.

In an embodiment, the opening liner 71 is made from the same material as the passageway liner 70. In an embodiment, the opening liner 71 is made from a different material to the passageway liner 70. For example, the passageway liner 70 may be Viton® and the opening liner 71 may be Teflon®. In an embodiment the passageway liner 70 and the opening liner 71 may be formed as a single piece i.e. they are integral. In an embodiment, the passageway liner 70 and the opening liner 71 may be formed separately but may be mounted within the support body such that they are continuous, i.e. there is no gap between an edge of the passageway liner 71 and an edge of the opening liner 70. In an embodiment, the passageway liner 70 is attached to the opening liner 71. In an embodiment, the passageway liner 70 and the opening liner 71 are attached with an adhesive on a connecting surface.

Figure 7:
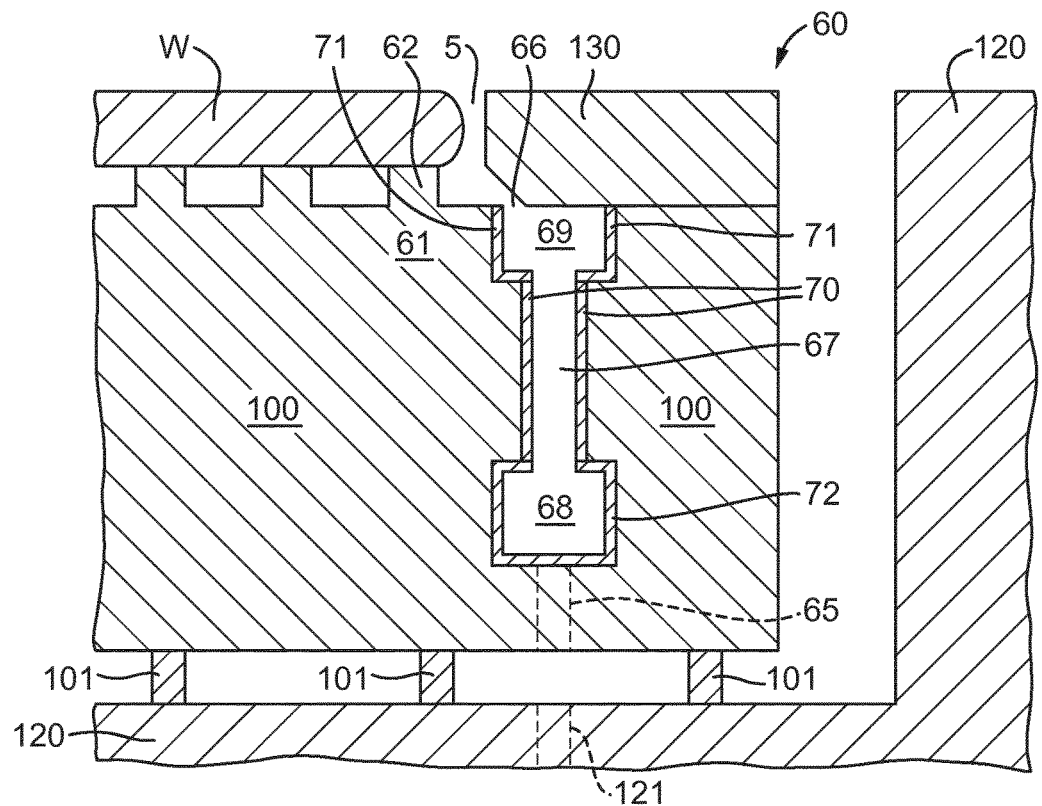
Figure 8:
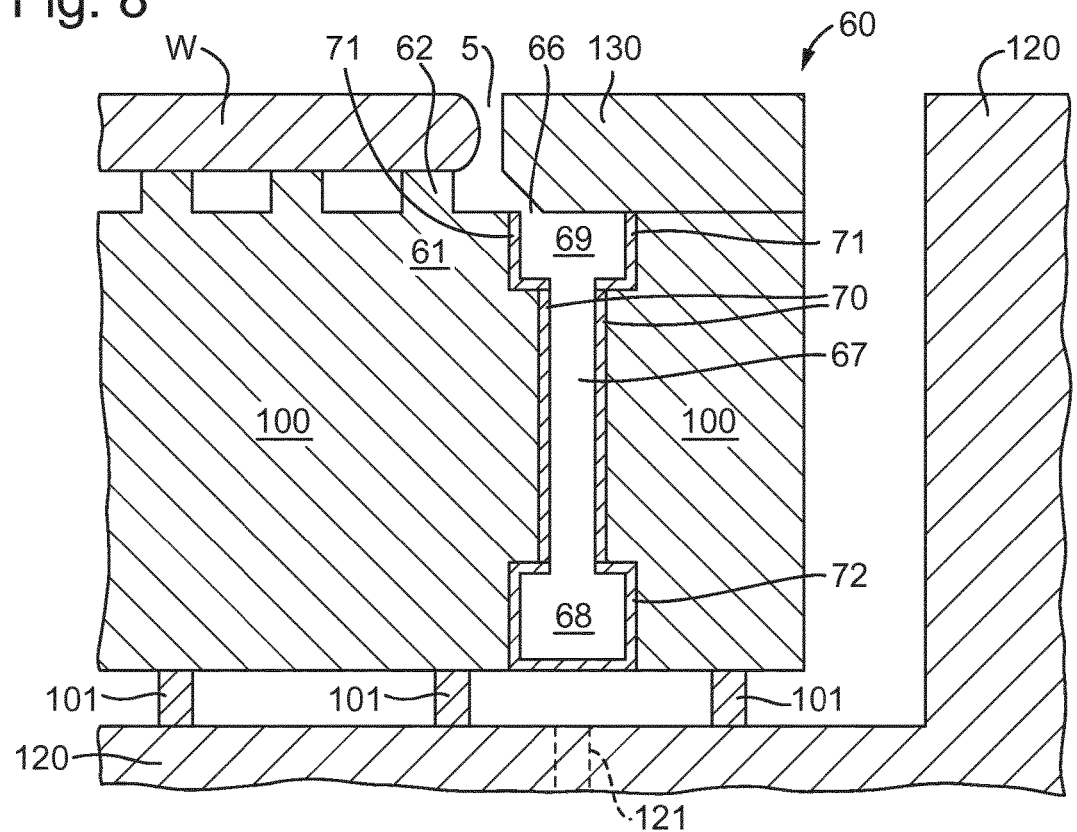

As depicted in FIG. 7, in an embodiment, a channel liner 72 is mounted in the channel 68. As depicted in FIG. 8, the channel 68 may be a groove along the bottom surface of the support body 100, i.e. the channel 68 forms an opening on the bottom surface of the support body 100. This embodiment may make it easier to form or insert the channel liner 72 in the support body 100. In an embodiment, channel liner 72 may be mounted in the channel 68 such that the bottom side of the channel liner 72 is substantially in-line with the bottom side of the support body 100. The shape of the channel 68 and/or the channel liner 72 is not particularly limiting. The channel liner 72 is thermally insulated substantially to thermally decouple the support body 100 from fluid in the channel 68. The channel liner 72 may be used in addition to any of the above described liners. As depicted in FIGS. 7 and 8, the channel liner 72 may be provided in addition to the passageway liner 70 and the opening liner 71. Alternatively, the channel liner 72 may be provided in addition to the passageway liner 70 without the opening liner 71.

In an embodiment, the channel liner 72 is mounted in the channel 68. In an embodiment, the channel liner 72 is inserted into the support body 100. In an embodiment, the channel liner 72 is mounted inside the channel 68 by forming layers of a material to form a liner inside the passageway 67. In an embodiment, the channel liner 72 may be mounted inside the channel 68 by spraying a liquid material into the channel 68 which may solidify to form the channel liner 72. The channel liner 72 may be formed using a 3-D printer and then mounted inside the support body 100. The channel liner 72 may be formed by extrusion. The channel liner 72 may be formed by casting and curing a liquid material, for example liquid PTFE, in the channel 68 and processing the material, once solidified, to form the channel liner 72. Processing may include drilling and/or milling In an embodiment, the channel liner 72 has a thickness (i.e. the width of the walls defining the channel liner 72) of at least 0.2 mm. In an embodiment, the channel liner 72 has a thickness of at least 0.5 mm. In an embodiment, the channel liner 72 has a thickness of at least 1.0 mm. The channel liner 72 having at least these thicknesses may improve the thermal insulation provided by the channel liner 72. The thicknesses provided may be the minimum thickness of any portion of the channel liner 72. The thickness of the channel liner 72 may be uniform, i.e. the channel liner 72 may have substantially the same thickness around the inside of the channel 68. In this instance, substantially the same thickness may mean within 10% of the desired thickness, for example 0.2 mm±0.02 mm.

In an embodiment, the channel liner 72 is made of a material selected substantially to thermally decouple the support body 100 from fluid in the channel 68. Therefore, the material of the channel liner 72 is selected to reduce or prevent heat transfer between the fluid in the channel 68 and the support body 100. Thus the channel 68 is isolated using a channel liner 72 formed using material with a low thermal conductivity. In an embodiment, the channel liner 72 is made of a material having a thermal conductivity of less than or equal to about 0.5 W/mK at 25° C., preferably less than or equal to 0.1 W/mK at 25° C., or more preferably less than or equal to about 0.05 W/mK at 25° C. In an embodiment, the channel liner 72 is made of a material having a thermal conductivity of greater than or equal to 0.01 W/mK at 25° C., or greater than or equal to 0.02 W/mK at 25° C., or at 25° C. greater than or equal to 0.03 W/mK at 25° C. In an embodiment the channel liner 72 is made of a material having a thermal conductivity of approximately 0.01 to 0.5 W/mK at 25° C., preferably approximately 0.02 to 0.1 W/mK at 25° C., or more preferably approximately 0.03 to 0.05 W/mK at 25° C.

Providing a channel liner 72 with low thermal conductivity as described may have the advantage that heat conductance of the channel liner 72 is relatively poor compared to materials used for the surrounding support body 100 and other components of the substrate support apparatus 60. Therefore, the channel liner 72 may have significant heat-resistance compared to surrounding components or parts of the substrate support apparatus 60. As such, a temperature load, for example, as a result of evaporation described above or due to a difference in temperature between the fluid in the channel 68 and the surrounding support body 100, will have a reduced effect on the surrounding support body 100.

In an embodiment, the channel liner 72 is made of polytetrafluoroethylene (PTFE e.g. Teflon®), which has a thermal conductivity of approximately 0.25 W/mK at 25° C. In an embodiment, the channel liner 72 is made of high-density polyethylene (HDPE), which has a thermal conductivity of approximately 0.45 W/mK at 25° C., In an embodiment, the channel liner 72 is made of polypropylene (PP), which has a thermal conductivity of approximately 0.15 W/mK at 25° C. In an embodiment, the channel liner 72 is made of polyvinyl chloride (PVC), which has a thermal conductivity of approximately 0.19 W/mK at 25° C. In an embodiment, the channel liner 72 is made of rubber, which has a thermal conductivity of approximately 0.13 W/mK at 25° C. In an embodiment, the channel liner 72 is made of cork, which has a thermal conductivity of approximately 0,07 WmK at 25° C. In an embodiment, the channel liner 72 is made of Viton®, which has a thermal conductivity of approximately 0.19-30 W/mk at 25° C. In an embodiment, the channel liner 72 is made using two or more of the above-mentioned materials, Other materials may be used for the channel liner 72.

In an embodiment, the channel liner 72 is made of a material having a specific heat capacity ($c_p$) greater than or equal to about 0.8 kJ/kg.k, or preferably greater than or equal to about 1.0 kJ/kg.k, or more preferably greater than or equal to about 1.5 kJ/kg.k. In an embodiment, the channel liner 72 is made of a material having a specific heat capacity ($c_p$) less than or equal to 4.0 kJ/kg.k, or less than or equal to 3.5 kJ/kg.k, or less than or equal to 3.0 kJ/kg.k. In an embodiment, the channel liner 72 is made of a material having a specific heat capacity ($c_p$) of approximately 0.8 to 4.0 kJ/kg.k, or preferably, approximately 1.0 to 3.5 kJ/kg.k, or more preferably, approximately 1.5 to 3.0 kJ/kg.k. The specific heat capacity ($c_p$) is the isobaric specific heat capacity at approximately 25° C.

In an embodiment, the material used for the channel liner 72 is selected to have a hydrophobic surface in the channel 68 i.e. the channel liner 72 is formed of a hydrophobic material. In an embodiment, the channel liner 72 has a hydrophobic layer on the inner surface of the channel liner 72 to repel liquid. Having a hydrophobic surface on the inner surface of the channel liner 72 may be advantageous in removing more efficiently liquid from inside the channel 68. This is because liquid on the hydrophobic surface of the channel liner 72 is more likely to form droplets with an increased contact angle on the hydrophobic surface and are therefore, more likely to move more quickly from the channel 68. For example, material used on the inner surface of the channel liner 72 (i.e. as a material layer or the material for forming the channel liner 72) has a the contact angle water of approximately 90°-160°, or preferably approximately 100°-140°; or preferably approximately 110°-120°. The contact angle being the angle measured between the surface and an edge of a liquid droplet on the surface, the angle being measured through the droplet. This may be advantageous, because this may reduce the amount of liquid which evaporates in the channel 68, which is one of the causes of thermal variation in the support body 100. Additionally, this means that liquid may be removed more quickly from the channel 68 and therefore, the support body 100 as a whole, such that temperature difference between the fluid and the surrounding support body 100 will generally have less effect due to the liquid being present for a shorter time period. In an embodiment, the hydrophobic surface may be formed using any material with a suitable contact angle, for example, PTFE or PP.

In an embodiment, the channel liner 72 is a structural element, for example, a self-supporting structural element which does not require a support to avoid bending under self weight. In an embodiment, the channel liner 72 is not a coating. A coating is not a self supporting structural element as herein defined. In an embodiment, a portion of the channel liner 72 may extend out of the support body 100. In an embodiment, the portion of the channel liner 72 does not require any additional support (e.g. to be surrounded by the support body 100) because the channel liner 72 is made of a material and design such that it can support itself substantially without deflection.

In an embodiment, the channel liner 72 is made from the same material as the passageway liner 70 and/or the opening liner 71. In an embodiment, the channel liner 72 is made from a different material to the passageway liner 70 and/or the opening liner 71. In an embodiment the passageway liner 70 and the channel liner 72 may be formed as a single piece. In an embodiment the passageway liner 70, the opening liner 71 and the channel liner 72 may be formed as a single piece. In an embodiment, the passageway liner 70 and the channel liner 72 and/or the opening liner 71 may be formed separately but may be mounted within the support body such that they are continuous, i.e. the passageway liner 70 and the opening liner 71 and/or the channel liner 72 are directly connected.

In an embodiment, a further liner which may be referred to as an opening cover, or a roof liner, is provided above the opening groove 69. The roof liner 73 is depicted in FIG. 9.

Figure 9:
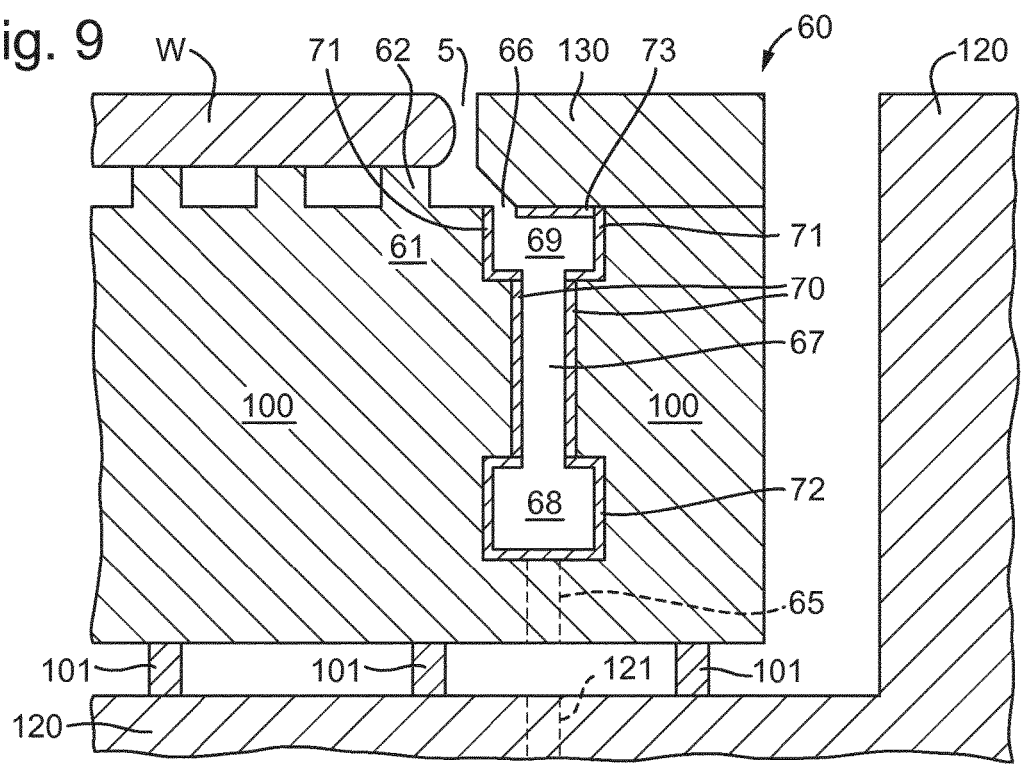

In this embodiment, the cover ring 130 is arranged to at least partially reduce the size of the opening 66, as depicted in FIG. 9. In this embodiment, the roof liner 73 is above at least a portion of the opening 66 which is defined by the opening groove 69. In this embodiment, the roof liner 73 may be mounted to cover at least a portion of the opening groove 69. In an embodiment, the roof liner 73 may be mounted to cover more than half, and preferably more than half, of the opening groove 69. In an embodiment, the roof liner 73 covers substantially all of the top of the opening groove 69 except the opening 66. The roof liner 73 may be provided instead of, or in addition to, the channel liner 72 and/or the opening liner 71 described in the above embodiments. Although the roof liner 73 and the channel liner 72 are depicted in FIG. 9 onwards, they are optional, although preferred, in the following embodiments. The roof liner 73 may have any of the features (i.e. thickness, thermal conductivity, specific heat capacity, material, hydrophobic surface and/or structural integrity) described above for the passageway liner 70, the opening liner 71 and/or the channel liner 72. The roof liner 73 may be made of the same material as at least one of the passageway liner 70, the opening liner 71 and/or the channel liner 72. The roof liner may be made as a single piece (i.e. integral with at least a part of the opening liner 71. Alternatively, the roof liner 73 and the opening liner 71 may be formed by separate pieces, but may be continuous when mounted in the support body 100. The roof liner 73 and the opening liner 71 may be attached to each other with an adhesive along a connecting edge. In an embodiment, the roof liner 73 is attached to a bottom surface of the cover ring 130 of the support body 100. For example, the roof liner 73 may be attached to the bottom surface of the cover ring 130 using an adhesive. This may be done before the cover ring 130 is installed. In an embodiment, the roof liner 73 is attached to a top of the opening groove 66, for example, it is attached to an edge of the opening liner 71. In an embodiment, the roof liner 73 may not be attached to the cover ring 130.

As discussed in relation to the above embodiments, fluid extracted from the edge of the substrate W via the opening groove 69, the passageway 67 and/or the channel 68 can lead to variation in the temperature in the support body 100 surrounding the fluid. The opening liner 71, the passageway liner 70 and/or the channel liner 72 may be used to thermally decouple the support body 100 from the fluid. The opening liner 71, the passageway liner 70 and/or the channel liner 72 may be used to directly reduce the transfer of heat to or from the support body 100. However, a temperature difference between the fluid and the support body 100 may also lead to thermal variation of the support body 100 via the cover ring 130. Therefore, the roof liner 73 may be provided to further thermally decouple the support body 100 from the fluid by reducing the thermal variation in the cover ring 130 which may be transferred to the support body 100.

In any of the above embodiments, the channel 68 may be provided radially inward of the opening groove 69. For example, as depicted in FIG. 10. Providing the channel 68 radially inwards may be more mechanically stable than when the channel 68 is provided closer to the edge of the support body 100. This may be particularly beneficial when the channel 68 is provided at the very base of the support body 100 as depicted in FIG. 8. Providing the channel 68 radially inwards of the opening groove 69 means that the passageway 67 will be angled with respect to the vertical as it provides a connection between the opening groove 69 and the channel 68. The angle of the passageway 67 to the vertical may be selected depending on the preferable locations of the opening groove 69 and the channel 68. Although FIG. 10 is depicted with the passageway liner 70, the opening liner 71, the channel liner 72 and the roof liner 73, it is understood that the opening liner 71, the channel liner 72 and the roof liner 73 are optional and any one or a combination of these liners may be used in combination with the passageway liner 70 as described above.

In an embodiment, the support apparatus 60 comprises a channel element 110 as depicted in FIG. 11. In an embodiment, the channel element 110 is substantially thermally and/or mechanically decoupled from the support body 100. For example, the channel element 110 may be spaced from the support body 100. In an embodiment, substantially the whole of the channel element 110 is spaced from substantially the whole of the support body 100. In an embodiment, the channel element 110 is positioned in a recess in the support body 100. The channel element 110 is depicted without an opening liner 71 and/or channel liner 72, however, the channel element 110 may be provided with an opening channel 71 and/or a channel liner 72 as described in any of the above embodiments.

Thermally decoupling the channel element 110 from the support body 100 has the advantage that temperature variations in the channel 68 will have a reduced effect, maybe even no effect, on the temperature of the support body 100. Temperature variations in the channel element 110 will be reduced, or prevented, more effectively by providing heaters on or in the support body 100 near the channel element 110. Thermally decoupling the channel element 110 from the support body 100 means that the thermal control of the support body 100 will not have to account for as much thermal variation as it would otherwise have to.

Mechanically decoupling the channel element 110 from the support body 100 has the advantage that any expansion and contraction of the channel element 110 (e.g. due to the temperature variation of any fluid in the channel and evaporational loads) will have a reduced effect, or no effect, on the support body 100. This is because the channel element 110 is spaced from the support body 100 which can reduce the resulting distortion of the support body 100 due to any distortion of material around the channel 68 i.e. the channel element 110. Therefore, there is less distortion of the substrate W being held by the support body 100.

In an embodiment, the channel element 110 is spaced from the support body 100 by an intermediate gap 105 that comprises a vacuum, near vacuum or a layer of gas. A vacuum, near vacuum or layer of gas in the intermediate gap 105 reduces thermal transfer between the channel element 110 and the support body 100, particularly thermal transfer by conduction. As such, the intermediate gap 105 can substantially thermally and mechanically decouple the channel element 110 from the support body 100. In an embodiment, the intermediate gap is greater than 0.2 mm In an embodiment, the intermediate gap is approximately 0.2 mm to 2 mm or preferably 0.5 mm to 1 mm.

In an embodiment, the channel element 110 is connected to the support body 100 only via peripherally located connectors. By providing that the channel element 110 is connected to the support body 100 only by the peripherally located connectors, the heat transfer between the support body 100 and the channel element 110 is reduced. This reduces the effect of evaporative cooling in the channel 68 on the support body 100. This reduces the thermal variation in the support body 100 of the substrate support apparatus 60. In turn, this reduces the effects of the evaporative cooling on the substrate W and reduces overlay error.

In an embodiment, the material used for the channel element 110 has a Young's modulus greater than or equal to approximately 100 GPa, preferably greater than or equal to approximately 200 GPa, or more preferably greater than or equal to 300 GPa. In an embodiment, the material used for the channel element 110 has a Young's modulus of less than or equal to approximately 500 GPa, or less than or equal to approximately 450 GPa, or less than or equal to approximately 400 GPa. In an embodiment, the material used for the channel element 110 has a Young's modulus of approximately 100-500 GPa, or preferably approximately 200-450 GPa or more preferably approximately 300 GPa to 400 GPa. In an embodiment, the material used for the channel element 110 is siliconized silicon carbide (SiSiC), silicon carbide, aluminum, aluminum nitride, Zerodur®, or titanium. Alternatively, in an embodiment, the material may have a Young's modulus of approximately 0.1-100 GPa or more preferably from 5-50 GPa. For example, the material used for the channel element 110 may be a type of polymer, for example a thermosetting plastic, or the material may be quartz, or aluminum. Some of these materials, e.g. aluminum, may be beneficial because they can be used to make a relatively thin channel element 110 as described below. Additionally, it is beneficial to use a material, such as aluminum, which is relatively light weight and with good heat conducting properties.

In an embodiment, the channel element 110 is made from more than one material. In an embodiment, the channel element 110 is made from the same material as the support body 100. In an embodiment, the channel element 110 is made from a different material from the support body 100.

In FIG. 11, additional heaters are shown. In an embodiment, support body heaters 102a, 102b are provided. In an embodiment, at least one support body heater 102a, 102b is on or in the support body 100 and surrounding, in plan view, the passageway liner 70. Exemplary support body heaters 102a, 102b are shown in the support body 100 in FIG. 11. In FIG. 11, the support body heaters 102a, 102b are depicted at the surface of the support body 100. Additionally or alternatively, support body heaters may be located on the surface (outside) of the support body 100, or inside the support body 100. There may only be one support body heater 102a, 102b. The location of the support body heaters 102a, 102b is not particularly limited. However, the support body heaters 102a, 102b may be located to help thermally decouple the passageway 67, opening groove 69 and/or the channel 68 from the support body 100, i.e. by surrounding or being located adjacent and or in contact with the passageway liner 70, opening liner 71 and/or channel liner 72, respectively. In an embodiment, the at least one support body heater 102a, 102b may be controlled by the controller 500. The support body heaters 102a, 102b, may be connected to the support body 100, for example by use of an adhesive.

In FIG. 11, a channel element heater 117 is shown on the channel element 110. In FIG. 11, the channel element heater 117 is depicted on the surface of the channel element 110. Additionally or alternatively, channel element heaters 117 may be located on other surfaces of the channel element 110, at the surface of the channel element 110, or inside the channel element 110. In an embodiment, at least one channel element heater 117 is surrounding or adjacent, at least a part of the channel 68 or channel liner 72. There may only be one the channel element heater 117. The location of the channel element heater 117 is not particularly limited. However, the channel element heater 117 may be located to help thermally decouple the channel element 110 from the support body 100, i.e. by surrounding or being located adjacent and or in contact with the channel element 110 which is near to the support body 100. In an embodiment, the at least one channel element heater 117 may be controlled by the controller 500.

In an embodiment, combined heaters may be provided. For example, the support body heater 102a and the channel element heater 117 may be replaced with combined heater 102c. The combined heater 102c may be provided on or in the support body 100 and on or in the channel element 110. The combined heater 102c is depicted in FIG. 12. In FIG. 12, the combined heater 102c is depicted at the surface of the support body 100 and on the outside of the channel element 110. Additionally or alternatively, the combined heater 102c may be located in or on a surface of the support body 100 and in or on a surface of the channel element 110. Thus, the same heater may be used to provide the advantages described above in relation to the support body heater 102a and the channel element heater 117.

As depicted in FIG. 12, the support body heater 102b may also be extended to provide a combined heater 102d which may be provided on or in the channel element 110. The combined heaters 102c and 102d may be provided together or separately and optionally in combination with support body heaters 102a, support body heater 102b as described above and/or channel element heater 117 as described above. FIG. 12 depicts two combined heaters 102c and 102d. Only one, or additional combined heaters may be provided. The combined heaters 102c, 102d may be provided in such a way that each combined heater 102c, 102d may be located at least partially on or in a surface of the support body 100 and at least partially on or in a surface of the channel element 110. Either of the combined heaters 102c or 102d depicted in FIG. 12 may be decreased or increased in size to cover a smaller or greater portion of the support body 100 and/or the channel element 110. The combined heaters 102c and 102d may cover the channel element 110, e.g. may envelop the top and side surfaces of the channel element 110, and/or may cover the support body 100, e.g. may cover the sides of the support body 100 adjacent the channel element 110. The combined heaters 102c and 102d depicted in FIG. 12 may be extended and may be provided as a single combined heater, rather than two separate heaters.

In an embodiment, the channel element 110 of any of the above embodiments is optionally secured to the object table 120. The object table 120 may otherwise be referred to as a substrate table. In an embodiment, the channel element 110 is positioned within a recess of the object table 120 as depicted in FIGS. 11 onwards.

In an embodiment, the channel element 110 further comprises at least one drainage channel 65 which allows fluid in the channel 68 to exit the channel element 110. In an embodiment, the drainage channel 65 allows fluid to exit the support body 100 and pass into an extraction channel 121 in the object table 120.

In an embodiment, material may be used to at least partially fill the intermediate gap 105 between the channel element 110 and the support body 100. For example, a channel element insulator 106 may be provided in the intermediate gap 105 as depicted in FIG. 13. The channel element insulator 106 may be provided throughout the entire intermediate gap 105 as depicted in FIG. 13 or may be provided only over a portion of the intermediate gap 105. The channel element insulator 106 may be similar to the passageway liner 70 as described above except for its location between the support body 100 and the channel element 110. For example, the channel element insulator 106 may be formed of the same material on the passageway liner 70.

The channel element insulator 106 may be made of a material with a relatively low Young's modulus and low thermal conductivity. For example, the channel element insulator 106 may have a Young's modulus of greater than or equal to approximately 0.1 GPa. In an embodiment, the material used for the support body 100 has a Young's modulus of less than or equal to approximately 10 GPa. In an embodiment, the material used for the support body 100 has a Young's modulus of approximately 0.1-10 GPa. For example, the channel element insulator 106 may be made of a material having a thermal conductivity of less than or equal to about 10 W/mK at 25° C. The channel element insulator 106 may be made of a material having a thermal conductivity of greater than or equal to 0.02 W/mK at 25° C. The channel element insulator 106 may be made of a material having a thermal conductivity of approximately 0.02 to 10 W/mK at 25° C. The channel element insulator 106 may comprise Teflon®, Viton®, polyurethane foam and/or Teflon® foam.

Providing the channel element insulator 106 may reduce thermal transfer between the channel element 110 and the support body 100 due to the low thermal conductivity of the material. As such, the channel element insulator 106 can substantially thermally decouple the channel element 110 from the support body 100. The channel element insulator 106 may have the same thickness as the intermediate gap 105 described above.

As depicted in FIGS. 11, 12 and 13, the channel element 110 may further comprise channel element connectors 119. The channel element connectors 119 may be part of the channel element 110 or the channel element connectors 119 may be attached to the channel element 110, for example, using an adhesive. In an embodiment, the channel element 110 is connected to the object table 120 by the channel element connectors 119. The channel element connectors 119 may otherwise be referred to as burls. The channel element connectors 119 allow acceleration forces to be transferred from the object table 120 to the channel element 110. Providing gaps between the channel element connectors 119 reduces thermal transfer between the object table 120 and the channel element 110. Any of these connectors may optionally be provided in any of the following embodiments.

The channel element connectors 119 are optional. The channel element connectors 119 may be replaced with a direct interface between the channel element 110 and the object table 120. In an embodiment, the channel element 110 may alternatively or additionally be connected to the object table 120 by vacuum clamping, bolting, an adhesive and/or kinematic leaf spring connectors. The form of the connection between the channel element 110 and the object table 120 is not particularly limiting.

In an embodiment, the channel element 110 is connected to the support body 100 via the passageway liner 70. In this embodiment, an adhesive connector 112a may be provided between the passageway liner 70 and the channel element 110, The passageway liner 70 may be configured such that at least a portion of the passageway liner 70 extends from out of the base of the support body 100 as depicted in FIG. 14, The adhesive connector 112a may then be provided between the passageway liner 70 and the channel element 110. In an embodiment, the adhesive connector 112a may be an adhesive ring, as depicted in FIG. 14. In an embodiment, the adhesive connector 112a may comprise a polymer based adhesive, for example a silyl modified polymer, for example Simson® ISR 70-03. In an embodiment, the adhesive connector 112a may be provided over the entire bottom surface of the passageway liner 70 as depicted in FIG. 14. In an embodiment, the adhesive connector 112a may comprise a polymer ring (not shown). The polymer ring may be provided with the adhesive connector 112a on either side of the bottom ring, the adhesive connector 112a being in contact with the passageway liner 70 on one side, and the channel element 110 on the other. Using an adhesive connector 112a may be an inexpensive way to provide a connection between the support body 100 and the channel element 110. This type of connection may be beneficial in that the connection restricts translation of the channel element 110 relative to the passageway liner 70 and thus the support body 100, but allows the channel element 110 to expand and contract without having a large effect on the support body 100.

As depicted in FIG. 14, the passageway liner 70 may extend out of the support body 100 and heaters may be arranged around the support body 100 such as support body heater 102a depicted in FIG. 14. As previously indicated, support body heater 102a may be within the support body 100 or may not be provided located near the passageway liner 70, and the passageway liner 70 may be located adjacent to the support body 100 directly rather than the support body heater 102a depicted in FIG. 14. In other words, the passageway liner 70 may have a portion extending out of the support body 100 which is positioned adjacent a surface of the support body 100, rather than adjacent a support body heater 102a as depicted in FIG. 14.

In an embodiment, the adhesive connector 112a may be replaced with at least one magnet pair, similarly to as described in relation to FIG. 19 below. Each magnet pair may comprise at least two magnets, wherein one magnet is connected to the channel element 110 and the other magnet is connected the passageway liner 70. The magnet pairs may form a ring around the passageway liner 70 or a ring at the base of the passageway liner 70. Multiple magnet pairs could be provided. The magnet pair may be arranged as described above for the adhesive connector 112a. A magnet may be connected to each of the passageway liner 70 and the channel element 110 using an adhesive. This type of connection has the advantages as described in relation to the magnet pair 114 in FIG. 19 as described below.

Using a passageway liner 70 to connect the channel element 110 and the support body 100 means that the passageway liner 70 can be used to combine the function of connecting the opening passage 69 to the channel 68 as well as mechanically mounting the channel element 110 to the support body 100. This simplifies the apparatus and makes it more robust.

When connecting the channel element 110 to the support body 100 via the passageway liner 70, it may be beneficial to provide the passageway liner 70 with a thickness of at least 1.0 mm. Additionally or alternatively, it may be preferable to form the passageway liner 70 using Viton®. Using Viton® for the passageway liner 70 may be beneficial because it may be easier to use than other materials, for example, Viton® is easier to glue than other materials such as Teflon®. Providing a passageway liner 70 being formed of Viton® with the described thickness may be beneficial because, for example, this may allow the channel element 110 to expand, shrink and/or shake without causing significant disturbance to the support body 100.

The thickness of the channel element 110 may be reduced to increase the intermediate gap 105 as depicted in FIG. 15.

Thus, the channel element 110 may only comprise a relatively thin wall surrounding the channel 68. This may allow a larger insulating intermediate gap 105, or a larger channel element insulator 106 to be provided between the channel element 110 and the support body 100 to further thermally insulate the channel element 110 from the support body 100. For example, the distance between the channel element 110 and the support body 100 may be greater than the intermediate gap 105 described above. The distance between the channel element 110 and the support body 100 may be greater than or equal to approximately 1.0 mm, or preferably greater than or equal to approximately 1.6 mm. Additionally, providing a thin walled channel element 110 reduces the mass of channel element 110 compared to using a larger channel element 110 depicted in previous embodiments which means that movement of the channel element 110 relative to the support body 100 may have less impact on the support body 100. A thin walled channel element 110 as described may be provided with any of the above described embodiments.

For example, the channel element 110 may have a thickness around at least a part of the channel 68 of approximately 0.5 mm to 5 mm, or more preferably, 1 mm to 2 mm. The channel element 110 may have a substantially uniform thickness around the channel 68.

The thin walled channel element 110 may be made from a material which easily allows the thin walls to be provided, for example, the channel element 110 may be formed using aluminum. Additionally, providing a thin walled channel element 110 as described may mean that the channel element 110 can usefully be machined after formation of the support body 100 and other components. Although the opening liner 71 and the roof liner 73 are depicted in FIG. 15, these liners are optional and neither, one or both may be provided. Additionally or alternatively, the channel liner 65 may additionally be provided to further insulate the channel 68.

In an embodiment, the channel element 110 is connected to the support body 100 via peripherally located connectors. The number of peripherally located connectors is not particularly limited. In an embodiment, there are at least 3 peripherally located connectors. In an embodiment, there are 6 or more peripherally located connectors.

The peripherally located connectors are used to connect the channel element 110 to the support body 100, such that when the acceleration forces are applied to the support body 100, the acceleration forces may be transferred to the channel element 110. The peripherally located connectors are configured to restrict the movement of the channel element 110 as a whole relative to the support body 100. In an embodiment, the peripherally located connectors are configured to limit the movement of the channel element 110 relative to the support body 100 in all 6 degrees of freedom (i.e. x, y, z, Rx, Ry, Rz). In an embodiment, the peripherally located connectors are configured to limit the movement of the channel element 110 relative to the support body 100 in all 6 degrees of freedom substantially equally. In an embodiment, the peripherally located connectors are configured to restrict movement of the channel element 110 as a whole relative to the support body 100. In an embodiment, the peripherally located connectors allow the channel element 110 to shrink and/or expand. In an embodiment, the channel element 110 may expand or shrink by bending the channel element connectors 119, however, translation of the channel element 110 may be substantially prevented by the channel element connectors 119, which keep the channel element 110 as a whole attached to the object table 120.

Figure 16:
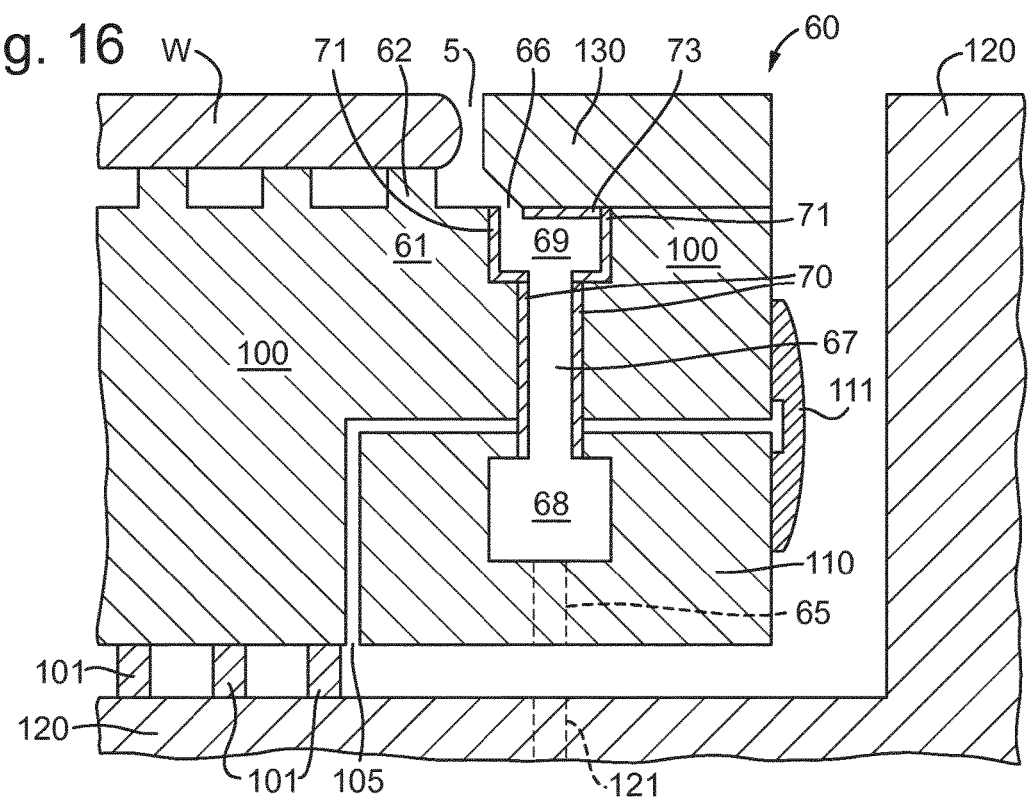

In an embodiment, the peripherally located connectors are kinematic spring leaf connectors attached to the support body 100 and the channel element 110 as depicted in FIG. 16. The kinematic spring leaf connectors 111 may be attached to the support body 100 and/or the channel element 110 with adhesive.

Figure 17:
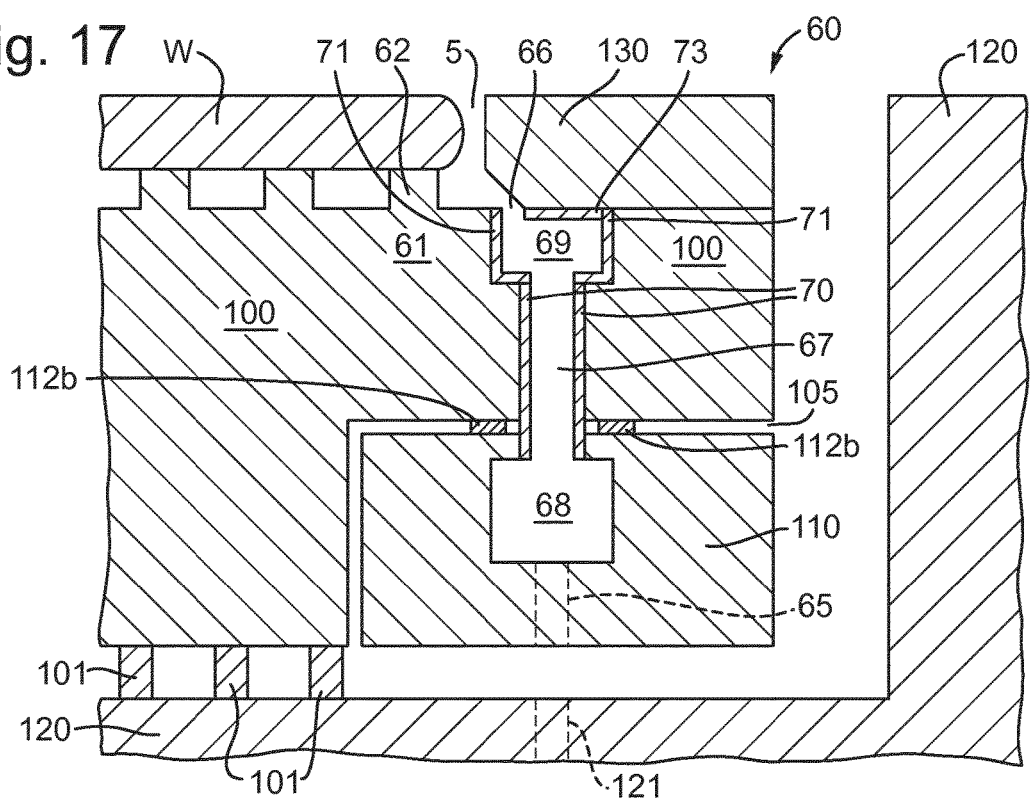

In an embodiment, the peripherally located connectors used to connect the channel element 110 to the support body 100 may be an adhesive connector 112*b*. In an embodiment, the adhesive connector 112*b*, may be provided in the intermediate gap 105. In an embodiment, the adhesive connector 112*b* may be an adhesive ring, as depicted in FIG. 17. In an embodiment, the adhesive connector 112*b* may comprise a polymer based adhesive, for example a silyl modified polymer, for example Simson ® ISR 70-03. In an embodiment, the adhesive connector 112*b*, may be provided around the circumference of the passageway liner 70 in plan view. In an embodiment, the adhesive connector 112*b* may be provided adjacent to the outside of the passageway liner 70, optionally, in contact with the passageway liner 70. In an embodiment, adhesive connector 112*b* may comprise a polymer ring (not shown). The polymer ring may be provided in the intermediate gap 105 with the adhesive connector 112*b* on either side of the polymer ring, the adhesive connector 112*b* being in contact with the support body 100 on one side, and the channel element 110 on the other. Using an adhesive connector 112*b* may be an inexpensive way to provide the peripherally located connectors. This type of connection may be beneficial in that the connection restricts translation of the channel element 110 relative to the support body 100, but allows the channel element 110 to expand and contract without having a large effect on the support body 100.

In an embodiment, the peripherally located connectors are loose connectors 113 as depicted in FIG. 18. In an embodiment, the loose connectors 113 are only active during certain types of movement of the substrate support apparatus 60. For example, in an embodiment, the loose connectors 113 are only active during installing and uninstalling the support body 100 in the recess of the object table 120. In an embodiment, vacuum clamping may be provided between the channel element 110 and the object table 120 and between the support body 100 and the object table 120 to keep channel element 110 in place when the loose connectors 113 are not active (i.e. when they are loose). The vacuum clamping may be provided in addition to the loose connectors 113 to keep the support body 100 and the channel element 110 in the desired location, relative to each other and other components of the lithographic apparatus. This type of connection may be beneficial in that the connection between the support body 100 and the channel element 110 is provided by the loose connectors 113 when the support body 100 is being positioned or removed from the object table 120.

In an embodiment, the peripherally located connectors comprise at least one magnet pair. An example showing at least one magnet pair is depicted in FIG. 19. Each magnet pair 114 comprises at least two magnets, wherein one magnet is connected to the channel element 110 and the other magnet is connected to the support body 100. Multiple magnet pairs 114 could be provided. The magnet pair 114 may be provided around the circumference of the passageway liner 70 in plan view. In an embodiment, the magnet pair 114 may be provided adjacent to the outside of the passageway liner 70, optionally, in contact with the passageway liner 70. In an embodiment, the magnets are connected to each of the channel element 110 and the support body 100 using an adhesive. This type of connection may be beneficial in that the connection restricts translation of the channel element 110 relative to the support body 100, but allows the channel element 110 to expand and contract without having a large effect on the support body 100. Having magnet pairs 114 may mean that the channel element 110 is more easily disconnected from the support body than other types of connection, and the channel element could also be easily reattached to the support body 100 in the correct position using magnet pairs 114. The magnetic forces provided by the magnet pair 114 press down the channel element 110. Therefore, it may not be necessary to use vacuum clamping additionally to maintain the position of the channel element 110. The channel element 110 is substantially thermally and mechanically decoupled from the support body 100 using the magnet pairs 114.

Figure 20:
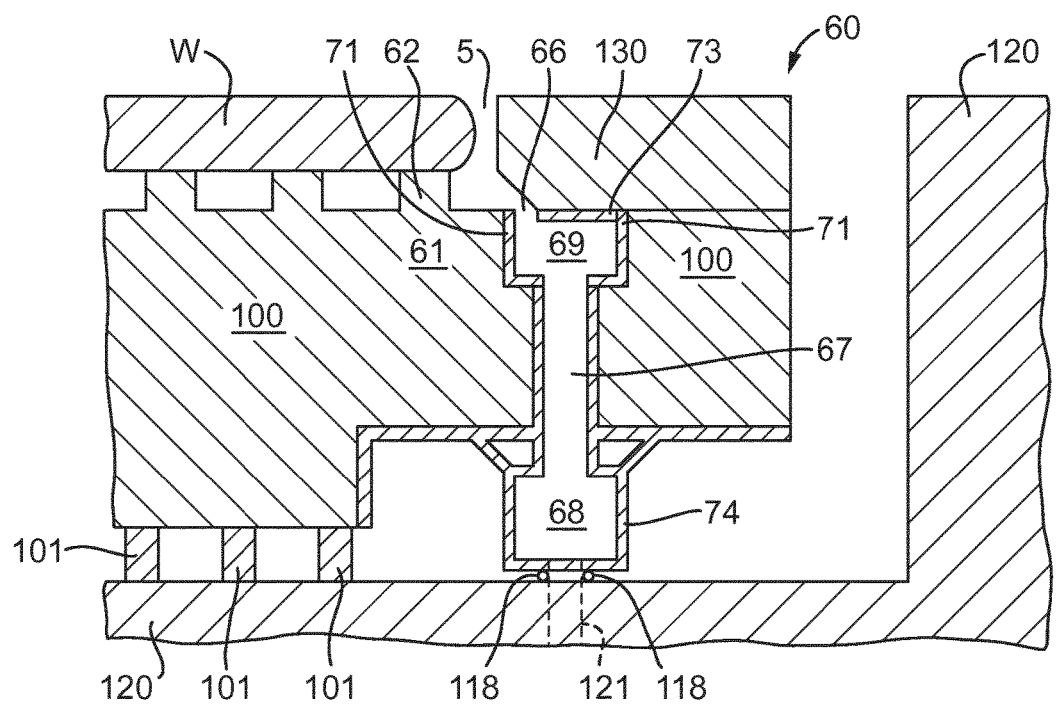

In an embodiment, the passageway liner may extend out of the support body 100 to form the channel 68, as depicted in FIG. 20. In this embodiment, passageway liner 74 may line the inside of the passageway 67 and form the channel 68 using a single piece i.e. through an integral piece. For example, the passageway liner 74 may be formed using a 3-D printer. The passageway liner 74 may extend along at least part of the surface of the support body 100 such that the passageway liner 74 can be attached to the support body 100 securely. For example, the passageway liner 74 may be adhered to the support body 100 using an adhesive. In an embodiment, the passageway liner 74 comprises at least one heater incorporated into the passageway liner 74. The passageway liner 74 may have any of the features (i.e. thickness, thermal conductivity, specific heat capacity, material, hydrophobic surface and/or structural integrity) described above for the passageway liner 70, the opening liner 71 and/or the channel liner 72. In this embodiment, the passageway liner 74 may be removably connected to the object table 120 via O-ring connectors 118 to allow fluid to pass from at least one opening in the channel portion of the passageway element 74 to enter an extraction channel 121 in the object table 120. In an embodiment, multiple liner elements are attached to each other to form the passageway liner 74.

In an embodiment, the channel 68 surrounds the substrate holder 61 and/or the substrate W in plan view. In an embodiment, the plurality of passageways 67 surround the substrate holder 61 and/or the substrate W in plan view. In an embodiment, the opening 66 surrounds the substrate holder 61 and/or the substrate W in plan view.

In the above embodiments, a cover ring 130 is optionally provided. In any of the above embodiments, the cover ring 130 may be separate from the support body 100, as depicted in the Figures. Alternatively, in any of the above embodiments, the support body 100 may include the cover ring 130 as part of the support body 100, i.e. the cover ring 130 is monolithic (integral) with the support body 100. By providing a cover ring 130 at the top of the support body 100 (as part of the same body or a separate body), the thermal effect on the liquid confinement structure 12 from fluid in the opening 66, passageway 67, the channel 68 and more generally from the support body 100 is reduced and vice versa. The shape of the cover ring 130 is not limiting, and therefore, the cover ring 130 may have any shape, for example the shape depicted in FIGS. 4 and 6 to 15 or the shape depicted in FIGS. 16 to 18.

Figure 21:
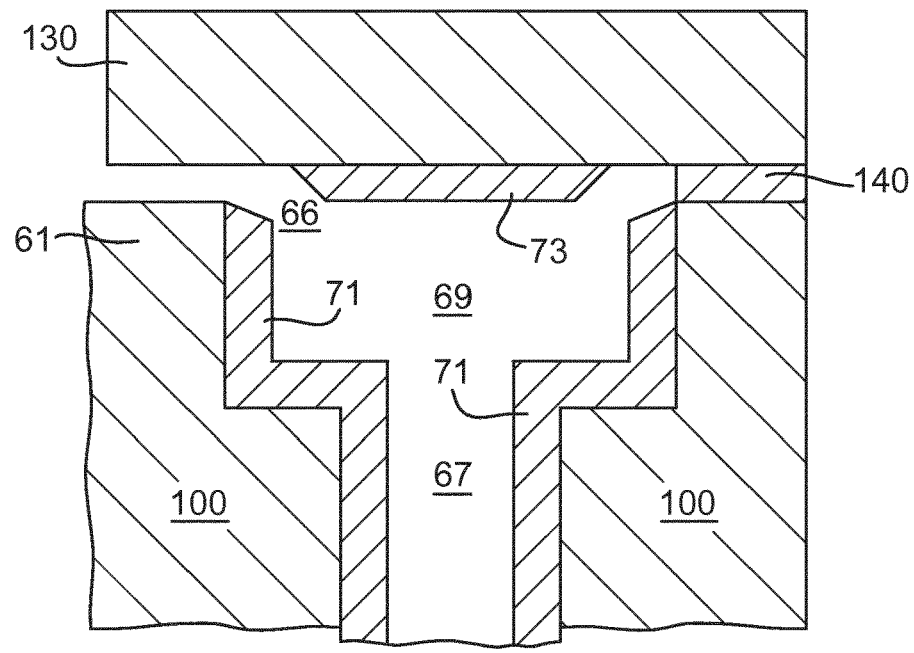

FIG. 21 depicts a close up section of the opening groove 69 and the surrounding areas. In the present embodiment, the cover ring 130 may be as described in relation to any of the above embodiments, except for the differences as herein described. The cover ring 130 of the above embodiments may be monolithic with the support body 100. However, in the present embodiment, as depicted in FIG. 21, the cover ring 130 is separate from the support body 100.

In the embodiment depicted in FIG. 21, the substrate support apparatus 60 comprises a roof liner 73 as described in any of the above embodiments. The opening 66 of the support body 100 may be defined across the top of the opening channel 69 located in the support body 100, i.e. as an opening in the top surface of the support body 100. The cover ring 130 may be mounted over the top of the opening 66 and attached to the support body 100 around the edge of the support body 100, as depicted in FIG. 21. Thermal variation of the cover ring 130 may be reduced or prevented due to the roof liner 73 positioned on the base of the cover ring 130 and thus, thermal variation of the support body 100 via the cover ring 130 may also be reduced. As described above, the roof liner 73 may be mounted on the base of the cover ring 130, for example using an adhesive. Alternatively, the roof liner 73 may be mounted by applying the roof liner 73 on the bottom of the cover ring 130 in liquid phase and allowing the liquid to solidify to form the roof liner 73. For example, the bottom of the cover ring 130 may comprise holes into which some or all of the liquid may enter to form the roof liner 73.

As depicted in FIG. 21, the substrate support apparatus 60 may optionally comprise an adhesive layer 140 between the cover ring 130 and the support body 100. The adhesive layer 140 may separate the cover ring 130 from the support body 100 such that there is no direct contact between the cover ring 130 and the support body 100. The adhesive layer 140 adheres the cover ring 130 to the support body 100. The transfer of thermal loads to or from the support body 100 may be reduced by separating the cover ring 130 from the support body 100. The adhesive layer 140 provided between the cover ring 130 and the support body 100 may act as a thermal barrier to reduce and/or prevent thermal loads passing between the cover ring 130 and the support body 100. The transfer of thermal loads from any fluid in the opening groove 69 to the support body 100 may be reduced by the additional use of an adhesive between the roof liner 73 and the cover ring 130.

Figure 22:
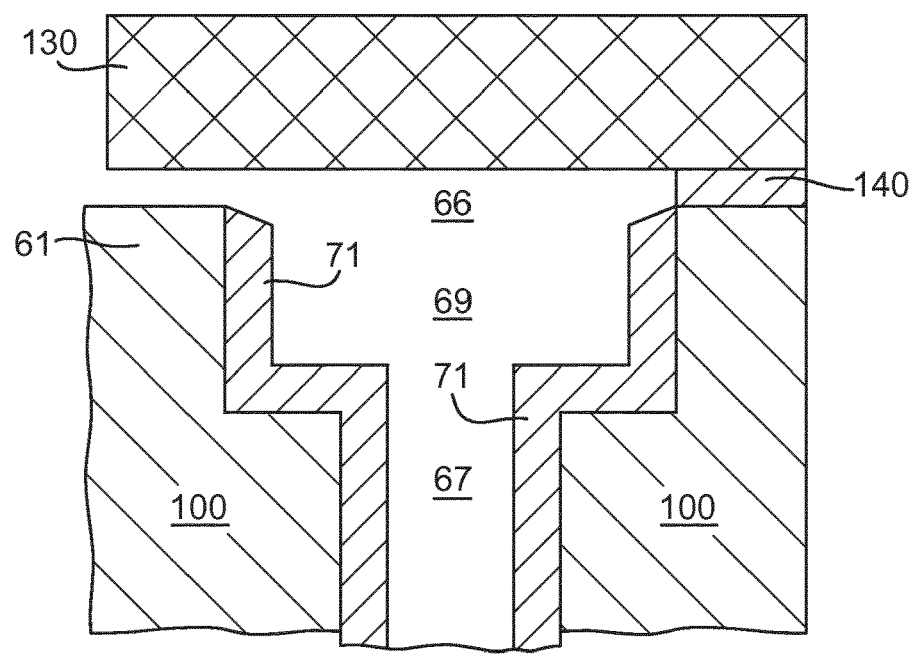

In a further embodiment, the cover ring 130 may be provided as depicted in FIG. 21. However, the material used for the cover ring 130 may be specifically chosen to have a low thermal conductivity. This embodiment is depicted in FIG. 22 without a roof liner 73. Although FIG. 22 shows the cover ring 130 without the roof liner 73, this feature could be included as described above.

The cover ring 130 may be formed using a material with low thermal conductivity. In an embodiment, the cover ring 130 has a lower thermal conductivity than the support body 100. In an embodiment, the thermal conductivity of the cover ring 130 is less than approximately 50 W/mK at 25° C. In an embodiment, the cover ring 130 is made of aluminum oxide ($Al_2O_3$), with a thermal conductivity of about 30 W/mK at 25° C. Preferably, in an embodiment, the cover ring 130 is made of a material having a thermal conductivity of less than or equal to approximately 2 W/mK at 25° C., or preferably less than or equal to approximately 1 W/mK at 25° C., or more preferably less than or equal to approximately 0.5 W/mK at 25° C. In an embodiment, the cover ring 130 is made of a material having a thermal conductivity of greater than or equal to approximately 0.01 W/mK at 25° C., or greater than or equal to approximately 0.02 W/mK at 25° C., or greater than or equal to approximately 0.03 W/mK at 25° C. In an embodiment the cover ring 130 is made of a material having a thermal conductivity of approximately 0.01 to 2 W/mK at 25° C., preferably approximately 0.02 to 1 W/mK at 25° C., or more preferably approximately 0.03 to 0.5 W/mK at 25° C.

In an embodiment, the cover ring 130 is made of a ceramic material. In an embodiment, the cover ring 130 is made of $SiO_2$ (fused quartz), with a thermal conductivity of about 1.4 W/mK at 25° C. In an embodiment, the cover ring 130 is made of Zerodur®, with a thermal conductivity of about 1.4 W/mK at 25° C. In an embodiment, the cover ring 130 is made of polyoxymethylene (POM), with a thermal conductivity of about 0.2-0.4 W/mK at 25° C. In an embodiment, the cover ring 130 is made of polytetrafluoroethylene (for example, Teflon®), with a thermal conductivity of about 0.2-0.3 W/mK at 25° C. In an embodiment, the cover ring 130 is made with glass, for example transparent glass), with a thermal conductivity of about 0.8-1.1 W/mK at 25° C.

Providing a cover ring 130 with low thermal conductivity as described may have the advantage that heat conductance of the cover ring 130 is relatively poor compared to materials used for the surrounding support body 100 and other components of the substrate support apparatus 60. Therefore, the cover ring 130 may have significant heat-resistance compared to surrounding components or parts of the substrate support apparatus 60. As such, the transfer of heat to or from the support body 100 via the cover ring 130 may be reduced, thus reducing thermal variation of the support body 100. Thus, the cover ring 130 itself may be adequately insulating without the roof liner 73.

In an embodiment, the cover ring 130 is made of a material having a specific heat capacity ($c_p$) greater than or equal to about 0.8 kJ/kg.k, or preferably greater than or equal to about 1.0 kJ/kg.k, or more preferably greater than or equal to about 1.5 kJ/kg.k. In an embodiment, the cover ring 130 is made of a material having a specific heat capacity ($c_p$) less than or equal to about 4.0 kJ/kg.k, or less than or equal to about 3.5 kJ/kg.k, or less than or equal to about 3.0 kJ/kg.k. In an embodiment, the cover ring 130 is made of a material having a specific heat capacity ($c_p$) of approximately 0.8 to 4.0 kJ/kg.k, or preferably, approximately 1.0 to 3.5 kJ/kg.k, or more preferably, approximately 1.5 to 3.0 kJ/kg.k. The specific heat capacity ($c_p$) is the isobaric specific heat capacity at approximately 25° C.

As discussed above, an adhesive layer 140 may be used between the cover ring 130 and the support body 100, as depicted in FIGS. 16 and 17. The adhesive layer 140 may have a thickness of approximately 200 µm or less. The type of adhesive material used for the adhesive layer 140 is not particularly limited. The adhesive layer 140 may be solid such that the adhesive layer 140 maintains a constant distance between the cover ring 130 and the support body 100, i.e. the adhesive used for the adhesive layer 140 may not be flexible.

The adhesive layer 140 may have a low thermal conductivity, and may therefore act as a thermal barrier to reduce or prevent thermal loads being transferred between the cover ring 130 and the support body 100. In an embodiment, the adhesive layer 140 may have a thermal conductivity of less than or equal to about 0.5 W/mK at 25° C., preferably less than or equal to 0.1 W/mK at 25° C., or more preferably less than or equal to about 0.05 W/mK at 25° C. In an embodiment, the adhesive layer 140 is made of a material having a thermal conductivity of greater than or equal to 0.01 W/mK at 25° C., or greater than or equal to 0.02 W/mK at 25° C., or at 25° C. greater than or equal to 0.03 W/mK at 25° C. In an embodiment the adhesive layer 140 is made of a material having a thermal conductivity of approximately 0.01 to 0.5 W/mK at 25° C., preferably approximately 0.02 to 0.1

W/mK at 25° C., or more preferably approximately 0.03 to 0.05 W/mK at 25° C. For example, the adhesive material used for the adhesive layer 140 may be the same as the glue described for the adhesive connectors, for example, the adhesive may be Simson® ISR 70-03 glue, having a thermal conductivity of approximately 0.35 W/mK at 25° C. The adhesive used for the adhesive layer 140 may be different to the adhesive used for the adhesive connectors.

Figure 23:
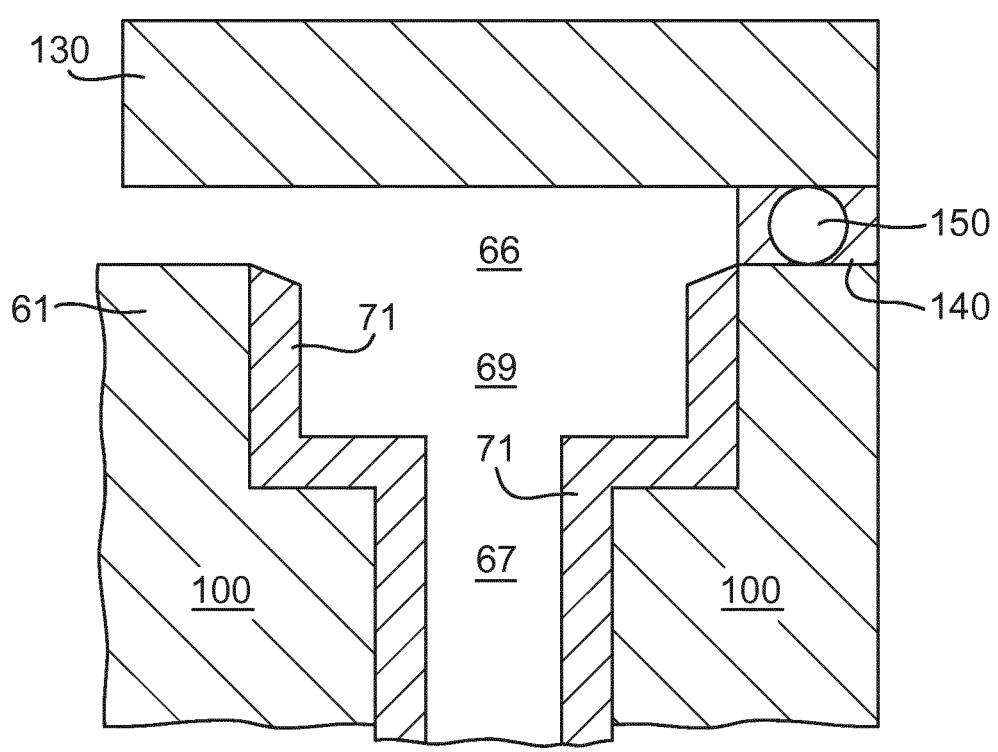

In an embodiment, the adhesive layer 140 described above may be provided with an increased thickness, as depicted in FIG. 23. For example, in an embodiment, the thickness of the adhesive layer 140 is between approximately 200 µm and approximately 500 µm, preferably between approximately 300 µm and approximately 500 µm, or more preferably between approximately 400 µm and approximately 500 µm. It is preferable that the thickness of the adhesive layer 140 is greater than approximately 200 µm, or preferably greater than approximately 300 µm, or more preferably greater than approximately 400 µm such that the adhesive layer 140 is thicker to provide a more effective thermal barrier. Providing a thicker adhesive layer 140 increases the effectiveness of the thermal barrier provided by the adhesive layer 140. An adhesive layer 140 of increased thickness as here described could be used in combination with any of the above embodiments. FIG. 23 shows the cover ring 130 without the roof liner 73, however this feature could be included as described above.

In an embodiment, the substrate support apparatus 60 may further optionally comprise at least one bead 150 located in the adhesive layer 140 between the cover ring 130 and the support body 100. An example of the bead 150 is depicted in FIG. 23. The bead 150 may be located so as to maintain a constant distance between the cover ring 130 and the support body 100. Therefore, the bead 150 may be used to keep the thickness of the adhesive layer 140 constant around the edge of the support body 100. The bead 150 may otherwise be referred to as a spacing member. The bead 150 may have a diameter which is the same as the thickness of the adhesive layer 140. In an embodiment, the diameter of the bead 150 is between approximately 200 µm and approximately 500 µm, preferably between approximately 300 µm and approximately 500 µm. It is preferable that the diameter of the bead 150 is greater than approximately 200 µm, or more preferably greater than approximately 300 µm.

In an embodiment, the bead 150 is substantially spherical. In an embodiment, the sphere may be hollow, and thus have a substantially ring shaped cross-section. In an embodiment, the sphere may be solid, and thus have a substantially circular shape in cross-section. In an embodiment, the bead may be cylindrical, wherein the cylinder is solid or hollow. In an embodiment, the bead 150 may have a low thermal conductivity to reduce the thermal variation passed from the cover ring 130 to the support body 100. The bead 150 may otherwise be referred to as a thermally insulating member (or optionally a spacing and thermally insulating member). Preferably, the bead 150 has substantially the same thermal conductivity as the adhesive layer 140, or more preferably, the bead 150 has a lower thermal conductivity than the adhesive layer 140. The bead 150 may comprise ceramic material. The bead 150 may comprise fused quartz (SiO$_2$) which may have a thermal conductivity as low as approximately 1.4 W/mK at 25° C.

Multiple beads 150 may be placed around the edge of the support body 100 in the adhesive layer 140. The number of beads 150 is not particularly limited. For example, there may be between approximately 50 and 200 beads, or between approximately 100 to 150 beads.

In any of the above embodiments, the opening 66 may be provided at one or more discrete locations around the periphery (e.g., circumference) of the edge of the substrate W. The opening 66 may, in plan, be slits or circular openings or any other shape. In an embodiment, three discrete circular openings are provided to extract a two-phase flow from the gap 5 of the substrate support apparatus 60. In an embodiment, the opening 66 is continuous around the support body 100. In other words, the opening 66 forms an unbroken path around the support body 100. In an embodiment, the opening 66 may have a width of approximately 5 mm to 20 mm. In an embodiment, the opening 66 may have a width of approximately 10 mm to 20 mm. The adhesive used in any of the above embodiments may be araldite. The adhesive used in any of the above embodiments may be a polymer based adhesive, for example a silyl modified polymer, for example Simson® ISR 70-03.

Any of the above embodiments may comprise additional passageways and/or channels in the support body 100 or the channel element 110. The additional passageways and/or channels may be provided to extract additional fluid from the substrate support apparatus 60 and/or may provide additional thermal conditioning in the substrate support apparatus 60.

Any of the above embodiments may comprise at least one thermal sensor to detect the temperature of a part of the substrate support apparatus 60. The results of the at least one thermal sensor may be used by the controller 500.

Any of the above embodiments may comprise additional heaters to control the temperature of surrounding parts of the support body 100 or other parts of the substrate support apparatus 60. Multiple heaters may be used. Multiple heaters of the same type may be used. Alternatively, combinations of different heaters may be used. The heaters may be located in or around the substrate support apparatus 60 to help thermally decouple different parts or components of the substrate support apparatus 60. In any of the above embodiments, at least one heater may be incorporated into the passageway liners 70 and 74, the opening liner 71, the channel liner 72, and/or the roof liner 73.

Although the support apparatus is described and depicted as substrate support apparatus 60, and the object holder is described and depicted as substrate holder 61 holding substrate W, in an embodiment, the object may not be a substrate. For example, the object may be a sensor and the object holder is a sensor holder being part of a general support apparatus, optionally without being able to hold a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate support apparatus so that substantially the entire uncovered surface of the substrate support apparatus and/or substrate is wetted. In such an unconfined immersion system, the liquid supply system may not confine the immersion liquid or it may provide a proportion of immersion liquid confinement, but not substantially complete confinement of the immersion liquid.

A method of operating an immersion apparatus using the substrate support apparatus 60 of any of the above embodiments may be provided. In particular, the method may comprise providing a liquid onto an object supported by a support body of a support apparatus; and removing liquid from an edge of the object through an opening in the support body, the opening being in fluid communication with a channel via each of a plurality of passageways in the support body, and a passageway liner being mounted in at least one of the plurality of passageways, the passageway liner being thermally insulating substantially to thermally decouple the support body from fluid in the at least one of the plurality of passageways.

A method for manufacturing a device may be provided in accordance with the present invention. The device manufacturing method may use a lithographic apparatus, the method comprising projecting a beam patterned by a patterning device onto a substrate W while supporting the substrate W with a substrate support apparatus 60 of any of the above embodiments.

A liquid supply system as contemplated herein should be broadly construed. In certain embodiments, it may be a mechanism or combination of structures that provides a liquid to a space between the projection system and the substrate and/or substrate support apparatus. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate support apparatus, or a surface of the space may completely cover a surface of the substrate and/or substrate support apparatus, or the space may envelop the substrate and/or substrate support apparatus. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

Clauses representing alternative arrangements of a lithographic apparatus according to the invention are listed below.

Clause 1. A support apparatus configured to support an object, the support apparatus comprising:

a support body comprising an object holder to hold an object;

an opening in the support body adjacent to an edge of the object holder;

a channel in fluid communication with the opening via each of a plurality of passageways in the support body; and a passageway liner mounted in at least one of the plurality of passageways, the passageway liner being thermally insulating substantially to thermally decouple the support body from fluid in the at least one of the plurality of passageways.

Clause 2. The support apparatus according to claim 1, wherein the passageway liner has a thickness of at least 0.2 mm, and preferably at least 0.5 mm, and more preferably at least 1.0 mm.

Clause 3. The support apparatus according to claim 1 or claim 2, wherein the passageway liner comprises a tube.

Clause 4. The support apparatus according to any of claims 1-3, wherein the passageway liner is made of a material having a thermal conductivity of less than or equal to about 0.5 W/mK, preferably less than or equal to about 0.1 W/mK, or more preferably less than or equal to about 0.05 W/mK.

Clause 5. The support apparatus according to any one of claims 1-4, wherein the passageway liner is made of a material having a specific heat capacity greater than or equal to about 0.8 kJ/kg.k, preferably greater than or equal to about 1.0 kJ/kg.k, or more preferably greater than or equal to about 1.5 kJ/kg.k.

Clause 6. The support apparatus according to any of claims 1-5, wherein the opening is continuous around the support body, in plan view, and is defined by an opening groove in the support body.

Clause 7. The support apparatus according to claim 6, wherein an opening liner is mounted in the opening groove, the opening liner being thermally insulating substantially to thermally decouple the support body from fluid in the opening groove.

Clause 8. The support apparatus according to claim 7, wherein the opening liner is made of a material having a thermal conductivity of less than or equal to about 0.5 W/mK, preferably less than or equal to about 0.1 W/mK, or more preferably less than or equal to about 0.05 W/mK.

Clause 9. The support apparatus according to either of claims 7 or claim 8, wherein the opening liner is made of a material having a specific heat capacity at constant pressure greater than or equal to about 0.8 kJ/kg.k, preferably greater than or equal to about 1.0 kJ/kg.k, or more preferably greater than or equal to about 1.5 kJ/kg.k.

Clause 10. The support apparatus according to any of claims 7-9, wherein the opening liner has thickness of at least 0.2 mm, and preferably at least 0.5 mm, and more preferably at least 1.0 mm.

Clause 11. The support apparatus according to any of claims 1-10, further comprising an object table, wherein the support body is supported by the object table, and the channel is in fluid communication with an object table opening in the object table.

Clause 12. The support apparatus according to claim 11, wherein there is a layer of gas between the support body and the object table.

Clause 13. The support apparatus according to any of claims 1-12, wherein the channel is continuous around the support body, in plan view.

Clause 14. The support apparatus according to claim 13, wherein a channel liner is mounted in the channel, the channel liner being thermally insulating substantially to thermally decouple the support body from fluid in the channel.

Clause 15. The support apparatus according to claim 14, wherein the channel liner has a thickness of at least 0.2 mm, and preferably at least 0.5 mm, and more preferably at least 1.0 mm.

Clause 16. The support apparatus according to either claims 14 or claim 15, wherein the channel liner is made of a material having a thermal conductivity of less than or equal to about 0.5 W/mK, preferably less than or equal to about 0.1 W/mK, or more preferably less than or equal to about 0.05 W/mk.

Clause 17. The support apparatus according to any of claims 14-16, wherein the channel liner is made of a material having a specific heat capacity at constant pressure greater than or equal to about 0.8 kJ/kg.k, preferably greater than or equal to about 1.0 kJ/kg.k, or more preferably greater than or equal to about 1.5 kJ/kg.k.

Clause 18. The support apparatus according to any of claims 1-17, further comprising a roof liner above at least a portion of the opening, the roof liner being thermally insulating substantially to thermally decouple the support body from fluid in the at least one of the plurality of passageways.

Clause 19. The support apparatus according to claim 18, wherein the roof liner has a thickness of at least 0.2 mm, and preferably at least 0.5 mm, and more preferably at least 1.0 mm.

Clause 20. The support apparatus according to either of claim 18 or 19, wherein the roof liner is made of a material having a thermal conductivity of less than or equal to about 0.5 W/mK, preferably less than or equal to about 0.1 W/mK, or more preferably less than or equal to about 0.05 W/mK.

Clause 21. The support apparatus according to any one of claims 18-20, wherein the roof liner is made of a material having a specific heat capacity at constant pressure greater than or equal to about 0.8 kJ/kg.k, preferably greater than or equal to about 1.0 kJ/kg.k, or more preferably greater than or equal to about 1.5 kJ/kg.k.

Clause 22. The support apparatus according to any of claims 1-21, wherein a portion of each passageway liner extends out of the support body into the channel.

Clause 23. The support apparatus according to any of claims 1-22, wherein the channel is in a channel element, the channel element being substantially thermally and mechanically decoupled from the support body.

Clause 24. The support apparatus according to claim 23, wherein there is a layer of gas between the channel element and the support body substantially to mechanically and thermally decouple the channel element from the support body.

Clause 25. The support apparatus according to either claim 23 or claim 24, wherein the channel element is connected to the support body via peripherally located connectors, preferably via at least 3 peripherally located connectors, or more preferably, via 6 peripherally located connectors.

Clause 26. The support apparatus according to claim 25, wherein the peripherally located connectors are configured to restrict movement of the channel element as a whole relative to the support body.

Clause 27. The support apparatus according to claim 25, wherein each of the peripherally located connectors comprises a magnet pair, wherein a first magnet of the magnet pair is located on or in the channel element and a second magnet of the magnet pair is located on or in the support body.

Clause 28. The support apparatus according to any of claims 23-27, wherein the channel element is made of a material which has a Young's modulus greater than or equal to 100 GPa, preferably greater than or equal to 200 GPa, or more preferably greater than or equal to 300 GPa.

Clause 29. The support apparatus according to any of claims 23-27, wherein the channel element is made of a material which has a Young's modulus between approximately 0.1 GPa and 100 GPa, preferably from 5 GPa to 50 GPa.

Clause 30. The support apparatus according to any of claims 1-29, wherein the channel surrounds, in a plan view, the object holder.

Clause 31. The support apparatus according to any of claims 1-30, further comprising a cover ring, wherein the cover ring is mounted on the support body.

Clause 32. The support apparatus according to claim 31, wherein an adhesive layer is provided between the cover ring and the support body, and wherein the thickness of the adhesive layer is between approximately 200 μm and 500 μm, more preferably between approximately 300 μm and 500 μm and more preferably between 400 μm and 500 μm.

Clause 33. The support apparatus according to claim 32, further comprising at least one bead located in the adhesive layer between the support body and the cover ring.

Clause 34. The support apparatus according to any of claims 31-33, wherein the cover ring is made of a material having a thermal conductivity of less than or equal to approximately 2 W/mK at 25° C., or preferably less than or equal to approximately 1 W/mK at 25° C., or more preferably less than or equal to approximately 0.5 W/mK at 25° C.

Clause 35. The support apparatus according to any of claims 31-34, wherein the cover ring is made of a material having a specific heat capacity at constant pressure greater than or equal to approximately 0.8 kJ/kg.k, preferably greater than or equal to approximately 1.0 kJ/kg.k, or more preferably greater than or equal to approximately 1.5 kJ/kg.k.

Clause 36. A lithographic apparatus comprising the support apparatus according to any one of the previous claims.

Clause 37. A method of operating an immersion lithographic apparatus, comprising: providing a liquid onto an object supported by a support body of a support apparatus; and removing liquid from an edge of the object through an opening in the support body, the opening being in fluid communication with a channel via each of a plurality of passageways in the support body, and a passageway liner being mounted in at least one of the plurality of passageways, the passageway liner being thermally insulating substantially to thermally decouple the support body from fluid in the at least one of the plurality of passageways.

Clause 38. A device manufacturing method using a lithographic apparatus, the method comprising:

projecting a beam patterned by a patterning device onto a substrate while supporting the substrate with a support apparatus, wherein the support apparatus comprises:

a support body comprising an object holder to hold the substrate;

an opening in the support body adjacent to an edge of the object holder;

a channel in fluid communication with the opening via each of a plurality of passageways in the support body; and a passageway liner mounted in at least one of the plurality of passageways, the passageway liner being thermally insulating substantially to thermally decouple the support body from fluid in the at least one of the plurality of passageways.

The invention claimed is:

1. A support apparatus configured to support an object, the support apparatus comprising:

a support body comprising an object holder to hold an object;

an opening in the support body adjacent to an edge of the object holder;

a channel in fluid communication with the opening via each of a plurality of passageways in the support body, wherein the channel is in a channel element structurally separate from the support body; and a passageway liner mounted in at least one of the plurality of passageways, the passageway liner being thermally insulating to substantially thermally decouple the support body from fluid in the at least one of the plurality of passageways, wherein at least part of the passageway liner spans at least part of a gap between the channel element and the support body.

2. The support apparatus according to claim 1, wherein the passageway liner has a thickness of at least 0.2 mm.

3. The support apparatus according to claim 1, wherein the opening is continuous around the support body, in plan view, and is defined by an opening groove in the support body.

4. The support apparatus according to claim 3, wherein an opening liner is mounted in the opening groove, the opening liner being thermally insulating to substantially thermally decouple the support body from fluid in the opening groove.

5. The support apparatus according to claim 1, further comprising an object table, wherein the support body is supported by the object table, and the channel is in fluid communication with an object table opening in the object table.

6. The support apparatus according to claim 1, wherein the channel is continuous around the support body, in plan view.

7. The support apparatus according to claim 1, wherein a channel liner is mounted in the channel, the channel liner being thermally insulating to substantially thermally decouple the support body from fluid in the channel.

8. The support apparatus according to claim 1, further comprising a roof liner above at least a portion of the opening, the roof liner being thermally insulating to substantially thermally decouple the support body from fluid in the at least one of the plurality of passageways.

9. The support apparatus according to claim 1, wherein a portion of each passageway liner extends out of the support body into the channel element.

10. The support apparatus according to claim 1, wherein the channel element is substantially thermally and mechanically decoupled from the support body.

11. The support apparatus according to claim 10, wherein there is a layer of gas between the channel element and the support body to substantially mechanically and thermally decouple the channel element from the support body.

12. The support apparatus according to claim 1, further comprising a cover ring, wherein the cover ring is mounted on the support body.

13. A lithographic apparatus comprising the support apparatus according to claim 1.

14. A method of operating an immersion lithographic apparatus, the method comprising:

providing a liquid onto an object supported by a support body of a support apparatus; and removing liquid from an edge of the object through an opening in the support body, the opening being in fluid communication with a channel via each of a plurality of passageways in the support body, wherein the channel is in a channel element structurally separate from the support body, and a passageway liner is mounted in at least one of the plurality of passageways, the passageway liner being thermally insulating to substantially thermally decouple the support body from fluid in the at least one of the plurality of passageways, wherein at least part of the passageway liner spans at least part of a gap between the channel element and the support body.

15. A device manufacturing method using a lithographic apparatus, the method comprising:

performing the method of claim 14, wherein the object is a substrate; and projecting a beam patterned by a patterning device onto the substrate while supporting the substrate with the support apparatus.

16. The method of claim 14, wherein the opening is defined by an opening groove in the support body and wherein an opening liner is mounted in the opening groove, the opening liner being thermally insulating to substantially thermally decouple the support body from fluid in the opening groove.

17. The method of claim 14, wherein a channel liner is mounted in the channel, the channel liner being thermally insulating to substantially thermally decouple the support body from fluid in the channel.

18. The method of claim 14, wherein a roof liner is located above at least a portion of the opening, the roof liner being thermally insulating to substantially thermally decouple the support body from fluid in the at least one of the plurality of passageways.

* * * * *